United States Patent [19]

Saltzman et al.

[11] Patent Number: 4,677,501
[45] Date of Patent: Jun. 30, 1987

[54] METHOD AND APPARATUS FOR DISPLAYING INDICATIONS OF INSTRUCTIONS IN PREVIOUSLY RECORDED MESSAGES

[75] Inventors: Jeremy Saltzman, Norwalk; John J. Dwyer, Stratford; Betsy Hipp, Orange, all of Conn.

[73] Assignee: Dictaphone Corporation, Rye, N.Y.

[21] Appl. No.: 691,261

[22] Filed: Jan. 14, 1985

[51] Int. Cl.[4] ............... G11B 15/18; G11B 27/30; G11B 27/34
[52] U.S. Cl. ............... 360/72.2; 360/72.1; 360/72.3; 360/137; 369/27; 369/28
[58] Field of Search ......... 360/13, 14.1–14.3, 360/71, 18, 27, 72.1–72.3, 79, 137; 369/25, 27, 28, 57, 58; 179/6.09

[56] References Cited

U.S. PATENT DOCUMENTS

| | | | |
|---|---|---|---|
| 4,007,491 | 2/1977 | Bolick, Jr. et al. | 369/27 |
| 4,200,893 | 4/1980 | Matison | 360/72.1 |
| 4,352,173 | 9/1982 | Titus, IV et al. | 369/27 |
| 4,398,279 | 8/1983 | Titus, IV et al. | 369/27 |
| 4,410,923 | 10/1983 | Patel | 360/137 |

Primary Examiner—Raymond F. Cardillo
Assistant Examiner—Steven R. Garland
Attorney, Agent, or Firm—Robert H. Whisker; Melvin J. Scolnick; David E. Pitchenik

[57] ABSTRACT

A storage medium in which previously recorded messages are stored is scanned for instruction signals representing the occurrences of instructions in those messages. Following the aforementioned scanning, if a message in condition to be played back includes an instruction, a suitable display is provided. Another display is provided if any further messages, not yet in condition to be played back, include instructions.

28 Claims, 7 Drawing Figures

METHOD AND APPARATUS FOR DISPLAYING INDICATIONS OF INSTRUCTIONS IN PREVIOUSLY RECORDED MESSAGES

BACKGROUND OF THE INVENTION

This invention relates to display apparatus and a method for operating same and, more particularly, to a method and apparatus for displaying the presence of instructions that may be included in previously recorded messages.

In using record/playback devices for the recording and playing back of dictated messages, the user (or author) often wishes to provide instructions to the transcriptionist, for example, instructions relating to the message itself, its transcription, the intended recipient of that message, or the like. Such instructions often are handwritten as a separate note and handed to the transcriptionist or otherwise affixed to the record medium upon which the message has been dictated. Alternatively, the author may give verbal instructions to the transcriptionist, either in a personal conference, or by telephone, or by other means (e.g. via messenger). Such techniques have proven less than satisfactory in communicating the author's instructions to the transcriptionist.

In some prior art recording/playback devices, an index scale formed of a paper strip is scanned as the author records his messages. While recording a message, the author may dictate an instruction, and the relative location of this instruction on the record medium is indicated by a suitable mark on the index strip. Typically, solenoid-activated scribing instruments, heater elements, or the like have been employed to be triggered by remotely controlled switches, usually provided on the dictation handset, to provide such instruction indicating marks. Then, when the transcriptionist is presented with the record medium for transcription, the marked index strip may be viewed to ascertain those locations at which instructions have been recorded. The record medium then may be advanced or rewound to those locations represented by the marks, whereupon the transcriptionist may play back the recorded instructions. However, if the index strip is misplaced or otherwise lost prior to transcription, the transcriptionist will not be made aware of the locations of dictated instructions and, when playing back those instructions, might not be cognizant of the fact that the reproduced verbal message is an instruction and not part of the message being transcribed.

Recently, such paper index strips have been replaced by an electronic display in which light elements, such as LED's, LCD's, or the like, are selectively activated to provide a viewable indication of the locations of previously recorded instructions. Examples of such electronic displays are disclosed in U.S. Pat. Nos. 4,051,540, 4,200,893 and 4,410,923. Other examples of electronic displays are known, and in all of these the location of an instruction generally is marked electronically on the record medium by a suitable instruction signal. This instruction signal typically is recorded as a distinguishable signal, such as one or more bursts of predetermined frequency, known as tone bursts. An instruction tone burst, also known as a "cue" tone, is recorded by the author, as described in the aforementioned patents, to designate the beginning of an instructional message.

Typically, messages are recorded on and played from a magnetic tape. In some prior art devices, the instructional message is recorded on the very same track as the informational message dictated by the author, and is designated by the aforementioned instruction cue tone which also is recorded in that track. In other devices, the instructional message is recorded on a separate track and the instructional cue tone may be recorded either on that same separate track or on the track reserved for the primary informational message. In either embodiment, it is understood that when an instructional message (and its designating instruction cue tone) is recorded in a length of tape along which the primary informational message is recorded, that informational message may be thought of as "containing" the instruction.

Although magnetic tape generally has been the preferable record medium for the recording and playing back of messages (and instructions within those messages), other record media may be used, such as magnetic belts or magnetic disks. These, however, are analogous to magnetic tapes and instructional messages may be recorded in the same track as the primary informational message or in a separate track. Similarly, the instruction cue tone which designates the location of that instructional message may be recorded in the same track as the primary informational message or in a separate track.

With the advent of relatively low cost solid-state storage devices, typically known as "memory chips", recorded messages may be digitized and stored as digital signals in such memory chips. Likewise, instructional messages and the locations of those instructional messages relative to the primary informational messages also may be stored in the memory chips. The digitized informational and instructional messages may be played back merely by reading out selected locations of those memory chips, converting the digitized signals back into analog form, and then reproducing the analog informational and instructional messages.

In using the recording/playback devices of the type described in the aforementioned patents for transcribing previously recorded messages, it is preferable first to operate those devices in a "scan" mode by which the record medium (e.g. the magnetic tape) first is scanned to detect the presence of instruction cue tones thereon. The detection of such instruction cue tones results in a linear display of those locations along the tape at which such instruction cue tones (and instructional messages) are recorded. The scanning of the record medium also results in a display of the locations of the end of each message (obtained by detecting end-of-message cue tones), thus furnishing the transcriptionist with a viewable display of the relative length and location of each message and the presence of instructional messages contained therein. Similar displays may be provided when the record medium is comprised of a magnetic belt or disk, or when the record medium is formed as one or more of the aforementioned memory chips.

There has been a recent trend toward miniaturization of record/playback devices, this trend being encouraged by proposals to utilize very small tape cassettes, such as described in U.S. Pat. Nos. 4,443,827 and 4,476,510, and by the use of the aforementioned memory chips. With such miniaturization, there may not be sufficient exterior space on the record/playback device to provide a display of the type described in U.S. Pat. No. 4,410,923 wherein a linear display of ends of messages and instructions is provided. Nevertheless, it still is desirable to provide a transcriptionist with an indication of whether any instructional messages have been recorded on the record medium to be transcribed and whether the informational message which is in the process of being or is about to be transcribed contains an instructional message.

OBJECTS OF THE INVENTION

Therefore, it is an object of the present invention to provide a method and apparatus for displaying the occurrences of instructions or instructional messages within a primary informational message that has been recorded in a storage medium.

Another object of this invention is to provide a method and apparatus of indicating whether a previously recorded message that is about to be or is in the process of being played back contains an instruction.

A further object of this invention is to provide a method and apparatus for indicating whether any messages previously recorded on a record medium, which messages had not yet been reached for play back, contain an instruction.

An additional object of this invention is to provide a method and apparatus, as aforesaid, wherein messages are recorded on a magnetic medium or a solid-state record medium such as a memory chip.

Various other objects, advantages and features of the present invention will become readily apparent from the ensuing detailed description, and the novel features will be particularly pointed out in the appended claims.

SUMMARY OF THE INVENTION

In accordance with the broader aspects of this invention, a method and apparatus are provided for detecting and displaying the occurrence of an instruction within a message that is being played back or is about to be played back from a storage medium. The storage medium may be a movable record medium, such as a magnetic tape, a magnetic belt, a magnetic disk, an optically readable medium (e.g. a so-called laser disk), or a solid-state medium, such as a memory chip. Other media from which previously recorded messages, either in analog or digital form, may be played back are contemplated.

In accordance with one aspect of this invention, a suitable indication is provided if the message then being played back or in position to be played back contains an instruction, and a different distinctive indication is provided if any further messages which have not yet been reached for play back include an instruction.

As a feature of this invention, the record medium is scanned prior to message playback, and the occurrence of each instruction is detected, as by the detection of an instruction signal which, preferably, is in the form of a frequency signal, or tone burst. It is contemplated that other instruction-representing signals, such as digital signals or other distinctive identifiable signals may be used. In one embodiment, end-of-message signals also are recorded on the record medium to demarcate the end of one message and the beginning of another. Such end-of-message signals also may be in the form of tone bursts, and are distinguishable from the instruction signals. In the preferred embodiment, each end-of-message signal is in the form of a single tone burst, and each instruction signal is in the form of two bursts of tone, the tone in both instances being of the same frequency. Alternatively, it is contemplated that the end-of-message and instruction signals may be distinguishable by utilizing different frequencies or other detectable characteristics.

In accordance with another aspect of this invention, a counter is incremented or decremented as the record medium is moved. For example, a tape counter may be decremented if the record medium is comprised of a magnetic tape and that magnetic tape is rewound. Similarly, this tape counter may be incremented when the magnetic tape is advanced in the forward direction. Upon detecting an end-of-message signal, the aforementioned count is stored in a suitable memory, thus indicating the location along the record medium at which the message ends, and upon continued scanning of the tape, the detection of an instruction signal results in a suitable representation, or "flag", stored in association with the end-of-message count. This process continues until the beginning or starting point of the record medium is reached. Thereafter, when the end of a message is reached (indicated by the concurrence of the count of the aforementioned counter and a stored count), the memory is examined to determine if an instruction flag is associated with the next end-of-message count. If so, an indication is provided that this next message (the message about to be transcribed) contains an instruction. In the event that no instruction is contained within this next message, the memory is examined to determine whether an instruction flag is associated with any other end-of-message count. If such an instruction flag is found, an indication is provided that an instruction is contained within a subsequent message that has not yet been reached for transcription. If neither the message about to be transcribed nor any other message contains an instruction therein, a suitable indication is provided that the remainder of the record medium contains no further instructions.

It is contemplated that, when a movable record medium is used, the instructional messages and their identifying instruction tone bursts (or instruction cue tones) may be recorded in the same track as the primary informational message or in respectively different tracks. Nevertheless, as used herein, if an instruction is recorded prior to the completion of an informational message, regardless of the particular track in which the instructional message and its identifying instruction cue tone are recorded, the instruction is considered to be "within" or "contained by" that informational message.

BRIEF DESCRIPTION OF THE DRAWINGS

The following detailed description, given by way of example and not intended to limit the present invention solely to the illustrated embodiments, should be read in conjunction with the accompanying drawings in which.

DETAILED DESCRIPTION OF A PREFERRED EMBODIMENT

Figure 1:
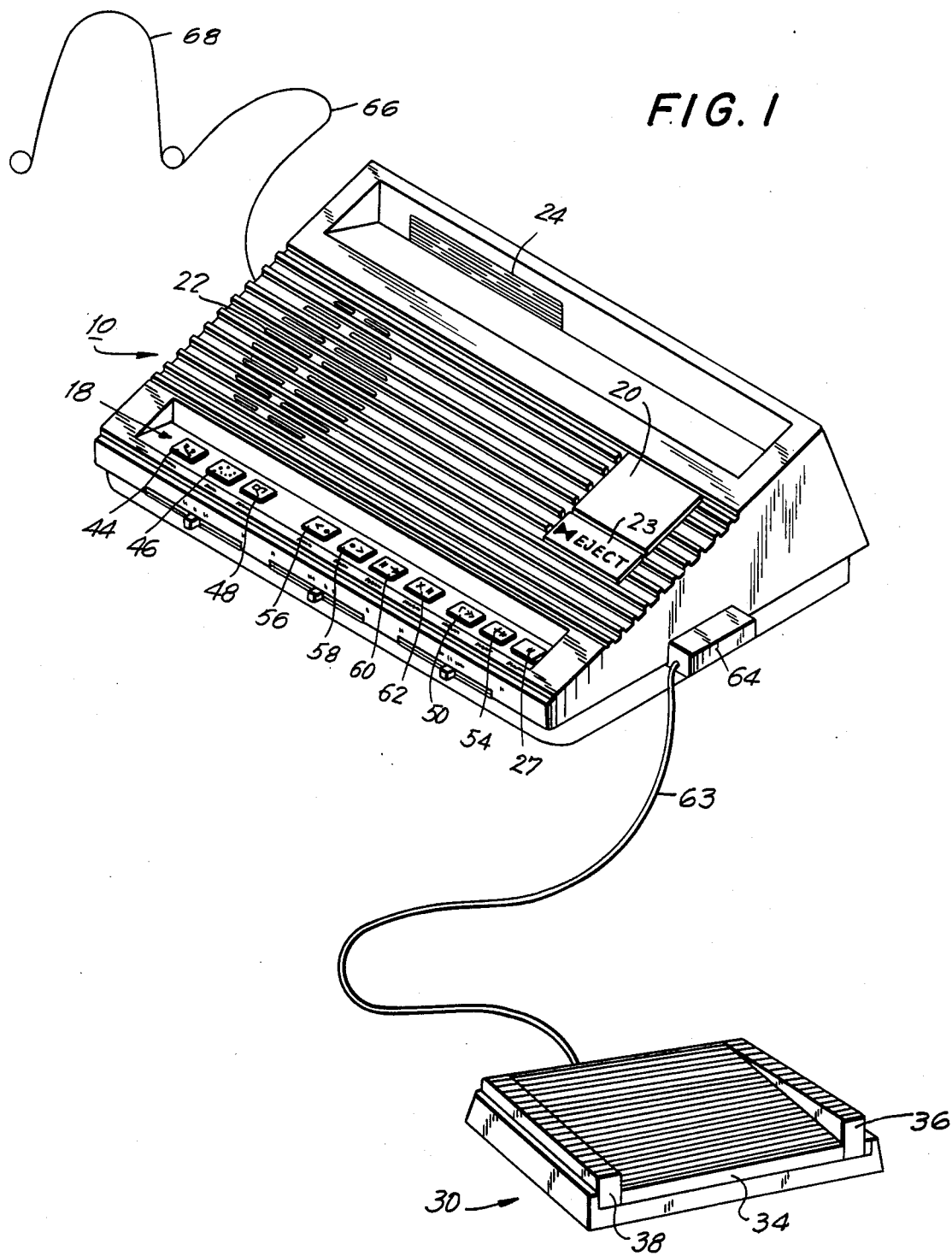
FIG. 1 represents the record/playback device with which the present invention finds ready application.

Referring now to the drawings, and in particular to FIG. 1, there is illustrated one embodiment of a record and/or playback device 10 in which the present invention finds ready application. Solely for purposes of illustration and explanation, device 10 is adapted to record and/or play back audio (or other informational) signals on a movable magnetic tape. However, it will become apparent from the ensuing description that the record medium upon which the audio signals may be recorded and from which those audio signals may be played back may be other conventional movable record media, such as a magnetic belt or a magnetic disk. Furthermore, the embodiment described below is operable as a playback device which functions to play back audio signals that have been recorded previously on the record medium. As such, the playback device need not have the capability of recording signals on the record medium, although this capability is advantageous if the playback device is to be operated, in some instances, as a recording device, such as a dictate/transcribe device. When used simply to play back previously recorded signals, the record medium may comprise, in addition to that described above, a device which does not permit alteration or re-recording of signals thereon, such as an optically readable medium, for example, a laser disk, a phonograph record, or the like. Moreover, although not described in detail herein, the playback device may be adapted to play back signals from a solid-state storage medium, such as a memory chip. In the embodiment wherein the playback device cooperates with a memory chip, it is appreciated that the audio signals are in the form of digital signals which, of course, are read out in a manner known to those of ordinary skill in the art and converted into analog form for audio reproduction.

In the description below, device 10 may be referred to merely as a "device", or as a "playback device", or as a "transcribe device". Nevertheless, it should be understood that the device functions to play back previously recorded messages which had been dictated by an author, such as letters, reports, memoranda, and the like. Accordingly, device 10 includes magnetic transducers, or heads, which are selectively controlled to reproduce the aforementioned messages from the record medium (referred to, for convenience, as a magnetic tape), and also to reproduce other informational signals that may be recorded on the record medium. As will be described below, although various types of informational signals may be recorded in addition to messages, for the purpose of the present description only those information signals referred to as "end-of-message" and "instruction" signals are described. Accordingly, suitable audio amplifiers, filters and other electronic circuits are provided for reproducing such signals. Device 10 also is provided with one or more motors for driving the record medium, or tape, bi-directionally. The tape is adapted to be driven in the forward direction at a relatively slow speed for the purpose of playing back previously recorded messages therefrom, and the tape also may be driven in the forward direction at a relatively fast speed, referred to herein as "fast forward" movement, for the purpose of rapidly gaining access to a desired location on the tape. Still further, the tape is adapted to be driven in the reverse direction, preferably at a relatively fast speed, for the purpose of rewinding the tape to access a message that had been recorded prior in time to the particular message then positioned for reproduction. Such rewind movement of the tape is conventional. It will be appreciated that, if desired, a single motor may be provided for the bi-directional movement of tape at two different speeds (e.g. the "play" speed and the "fast forward" speed), or separate motors may be provided to drive the tape at a fast speed in either direction and at the "play" speed. The particular tape transport mechanism and motors used to drive that mechanism form no part of the present invention per se.

Preferably, the magnetic tape from which the message signals are played back is contained within a tape cassette, such as described in U.S. Pat. No. 4,443,827, this tape cassette being disposed within a suitable cassette compartment 20 of device 10. An EJECT button 23 is provided to expose cassette compartment 20 so as to load a cassette therein or to remove the cassette therefrom. In the embodiment illustrated in FIG. 1, cassette compartment 20 is concealed from view by a suitable door.

Device 10, when operable as a dictating machine, is electrically connected to a hand-held microphone unit whereby voice signals are supplied to the recording circuit of the device from that microphone unit. The microphone unit may be provided with a loudspeaker such that audio messages which are played back from the magnetic tape are audibly reproduced by the loudspeaker housed within the microphone unit. Device 10 also includes a speaker 22 adapted to reproduce the messages played back from the magnetic tape. As will be described below, device 10 is provided with a selector switch for selecting either the loudspeaker housed within the microphone unit or loudspeaker 22, housed within the illustrated device 10, for reproduction of played back audio messages.

When operable as a transcribe machine, device 10 is connected to a foot pedal 30 which, as is conventional, is provided with foot pedal switches 34, 36 and 38 to select the direction and speed at which the magnetic tape is driven such that previously recorded messages may be played back, or the tape may be rewound, or the tape may be rapidly advanced to a section disposed further along the length thereof. As illustrated in FIG. 1, foot pedal 30 is electrically connected by means of a suitable cable 63 and plug 64 to a jack or connector (not shown) disposed on the side of the housing of device 10. It will be appreciated that an alternative communication link may be provided between the device and foot pedal 30, such as an infrared communication link for communication therethrough of appropriate signals representing the particular foot pedal switch that is activated by the machine user, referred to herein as the "transcriptionist". Such alternative communication links overcome the limited constraint of cable 63 which physically "ties" the foot pedal to device 10.

In the embodiment of foot pedal 30 illustrated herein, three separate foot pedal switching members are provided, including a relatively larger central switch member 34 which, when depressed, communicates a suitable signal (or signals) to device 10 for commanding a "play" mode of operation. As is conventional, in the "play" mode, the tape is advanced at a relatively slow rate and a suitable transducer, or playback head, is brought into magnetic coupling with the tape so as to play back the messages which have been recorded thereon. Foot pedal 30 also includes a rewind switch member 36 which, when depressed, transmits a suitable signal to device 10 for rewinding the tape. Switch member 38 is operable, when depressed, to transmit suitable signals to the device for commanding the fast forward movement of tape. The manner in which the respective "play", "rewind" and "fast forward" command signals are interpreted and utilized to effect the aforementioned modes of operation form no part of the present invention per se. If desired, conventional arrangements, known to those of ordinary skill in the art, may be adopted. For example, device 10 may include a suitably programmed microprocessor to sense the connection of plug 64 and to interpret the signals which are transmitted via cable 63 (or other communication link) to the device for commanding a selected mode of operation. Upon release of switch member 34 the tape is commanded to "backspace" a predetermined amount, and when none of switch members 34, 36 and 38 is depressed, a "stop" command is effected, whereby the movement of the tape is halted and, in one embodiment, the playback head withdraws from the tape.

When used as a transcribe machine, device 10 is coupled via a suitable connector 66 to headphone transducers 68. Here too, as an alternative to an electrical cable connection, other communication links may be provided. Headphone transducers 68 may be conventional and are adapted to transduce electrical audio signals supplied from the transcribe device to audio sound. In one embodiment, device 10 includes a suitable interlocking arrangement, either electromechanical or microprocessor-controlled, by which speaker 22 is disabled when headphone transducers 68 are connected via connector 66 to the device, whereby the audio messages played back from the tape are reproduced by the headphone transducers. Alternatively, a speaker selection arrangement may be provided.

Device 10 is provided with a plurality of control switches 18, sometimes referred to as keyboard switches, each switch being manually operable to control a particular function or establish a desired mode of operation. Typical of such control switches are a TELEPHONE switch 44, a CONFERENCE switch 46, a SPEAKER switch 48, a STOP switch 50, a SEARCH switch 54, a REWIND switch 56, a FAST FORWARD switch 58, a PLAY switch 60, an ERASE switch 62 and a RESET switch 27. Although a separate POWER switch is not illustrated, one may be provided, if needed. However, in the preferred embodiment, the operation of any of the illustrated keyboard switches, in addition to establishing a designated mode of operation, also serves to supply energizing power to the device, that is, to turn the device "on". After a predetermined idle period, that is, after a period during which the tape is not driven and none of control switches 18 is operated, energizing power automatically is removed, thus turning device 10 "off".

Each of switches 18 may be formed as a so-called touch-sensitive switch to produce a signal representing the actuation thereof when touched by the user (e.g. the transcriptionist) of device 10. Alternatively, switches 18 may be formed as tactile switches to carry out the same function. Although not clearly illustrated, a suitable light indicator, such as an LED or the like, may be juxtaposed adjacent a respective switch such that when that switch is actuated, the juxtaposed, or associated, light indicator is illuminated. Alternatively, each of switches 18 may include within its housing a suitable light element, such as a lamp, which is energized upon the actuation of that switch to select a corresponding mode of operation, thus providing the machine user with a viewable indication of the particular mode that has been selected. If desired, the switches, or selected ones thereof, may be operable as "toggle" switches which, as suggested by this expression, are actuated when touched by the machine user and remain actuated even if the user removes his finger therefrom. To deactuate that switch, that is, to release the mode of operation selected thereby, the actuated switch is touched again.

TELEPHONE switch 44 is adapted, when actuated, to enable device 10 to respond to incoming telephone calls. Typically, this telephone-operating mode is utilized when device 10 is configured as a recorder (e.g. a dictation machine) rather than a playback device. When the telephone mode is selected, device 10 is capable of functioning either as a telephone-answering machine or as a so-called remote dictating machine. In the latter mode of operation, audio messages or dictation are transmitted to the device via telephone lines (not shown) for recording on the magnetic tape. The TELEPHONE switch 44 may function as a toggle switch such that, once operated to select the telephone mode, it should be actuated once again to release that mode of operation.

CONFERENCE switch 46 is adapted, when actuated, to establish a "conference" mode of recording when device 10 is configured as a dictation machine. In this mode, the amplification of audio signals which are recorded on the magnetic tape is increased. Thus, suitable signals of relatively low level received by the microphone unit (not shown) are amplified substantially so as to be recorded with sufficient gain. CONFERENCE switch 46 may function as a toggle switch which, as mentioned above, must be actuated once again to release the "conference" mode that had been selected.

SPEAKER switch 48 preferably functions as a toggle switch and is adapted, when actuated, to select either speaker 22 for reproducing played back messages or, when device 10 is configured as a dictation machine with a microphone unit connected thereto, to select the loudspeaker disposed within the microphone housing for audible reproduction. In one embodiment, as mentioned above, when headphone transducers 68 are connected to device 10, speaker 22 is disabled and SPEAKER switch 48 likewise may be disabled. Alternatively, when configured as a transcribe machine, SPEAKER switch 48 may select either speaker 22 or headphone transducers 68 to reproduce the audio message played back from the magnetic tape.

STOP switch 50 is actuable to establish a "stop", or quiescent, mode of operation for device 10. Typically, STOP switch 50 may be operated to terminate a keyboard initiated fast forward, play or rewind mode of operation. It will be appreciated that a "keyboard initiated" operating mode is one that has been selected and initiated by the operation of one of switches 18.

PLAY switch 60, when manually actuated, toggles (or latches) to establish a playback mode similar to that which is established upon depressing play switch member 34 of foot pedal 30, but switch 60 need not be "held" down by the operator. Although the use of this PLAY switch 60 may seem to be redundant, it nevertheless offers the advantage of allowing a message to be played back without actual operation of foot pedal 30 which, in some instances, may not be conveniently located for the particular individual who wishes to listen to previously recorded messages. Once PLAY switch 60 is operated, tape movement may be halted by the actuation of STOP switch 50.

In the event that the author of one or more messages being transcribed from magnetic tape has recorded special instructional information thereon, such instructional information, as is conventional, is identified by recording an instruction signal, for example, an instruction cue tone. This instruction cue tone is recorded on the magnetic tape at the location whereat the instructional information begins. To access such instructional information, the SEARCH switch 54 is actuated, whereupon the magnetic tape is driven in a fast forward mode of operation and cue signal detecting electronics (not shown), including an appropriate cue signal detecting transducer, are energized to detect instruction cue tones. Upon detection of such an instruction cue tone, the mode of operation of device 10 is changed to a normal playback mode, whereby the instructional information which is recorded on the magnetic tape is reproduced. It is appreciated that the foregoing is a general description of the manner in which the magnetic tape is "searched" for instructional information, and this operation is carried out irrespective of the particular track in which the instructional information and instruction cue tones are recorded and, moreover, irrespective of whether the instructional information is represented by an instruction cue tone or other detectable signal which serves to identify the location of instructional information on the tape.

REWIND switch 56 is adapted, when operated, to establish a "rewind" mode of operation, whereby the magnetic tape is rewound at a rapid rate. Although REWIND switch 56 and rewind switch member 36 of foot pedal 30 perform similar functions, it will be described below that, when REWIND switch 56 is operated, that is, when the rewind operation is commanded by the operation of the keyboard switch, the magnetic tape is rewound until instruction cue tones are detected, whereupon the tape pauses. This permits an operator (e.g. the transcriptionist) to rewind the tape in order to access instructional information for playback. Furthermore, and as will be described in greater detail below, when a fresh tape cassette is loaded into compartment 20 for transcription, the first operation of the keyboard REWIND switch 56 results in a scanning operation, whereby the magnetic tape is rewound and scanned for the location of both end-of-message cue tones and instruction cue tones. The detection of such cue tone signals serves to operate a display (to be described) which may be helpful to the transcriptionist in preparing the transcription of various messages recorded on the tape. More particularly, this scanning of the tape identifies those locations therealong whereat each end-of-message cue tone is recorded, thus providing a representation of the end of a respective message, or letter, and the beginning of the next. Also, this scanning of the tape serves to identify those particular messages which contain instructional information.

FAST FORWARD switch 58 may be similar to REWIND switch 56 and is adapted, when operated, to establish the fast forward mode of operation. It will be recognized that the operation of the keyboard FAST FORWARD switch 58 and the operation of the foot pedal fast forward switch member 38 serve substantially similar functions, although switch 58 is a toggle switch that need not be continually depressed to maintain the fast forward operation. However, the operation of the keyboard FAST FORWARD switch merely advances the tape at relatively high speed, whereas the operation of the foot pedal fast forward switch serves not only to advance the tape but also to temporarily halt the tape at each end-of-message or instruction cue tone that is encountered.

ERASE switch 62 is adapted to be actuated concurrently with either REWIND switch 56 or FAST FORWARD switch 58 so as to establish an "erase" mode of operation. In this mode, the magnetic tape is advanced or rewound at a relatively high speed while an electromagnetic erase circuit is triggered to erase the audio information which may have been recorded previously on the magnetic tape.

As illustrated, device 10 is provided with a display 24 which is adapted to provide visual indications which are helpful to the user (the transcriptionist in the embodiment described herein) in locating the present position of the magnetic tape as it is being transcribed, rewound or advanced, and to ascertain whether any instructional information has been recorded. For example, display 24 may be similar in many respects, to the display set out in copending application Ser. No. 564,480, filed Dec. 21, 1983, and assigned to the assignee of the present invention. Thus, display 24 may be provided with a plural-digit numerical display, such as a three-digit display, each digit being represented by a seven-segment LCD element or other conventional visual indication numerical display device, such as an LED display, or the like. This numerical display is adapted to be incremented and decremented as the tape is advanced and rewound so as to provide a numerical indication of the amount of tape which has been transported.

Display 24 also may be provided with a bar graph, or index, comprised of a plurality of individual elements or segments, such as LCD segments, LED segments, or the like. These segments are adapted to be selectively energized to provide an indication of the approximate quantity of tape which has been transported, thereby providing a bar graph display of the present position of the tape. As an example, if this bar graph display is formed of ten segments, each segment may represent approximately 10% of the overall length of tape; and as successive tape is transported in the forward direction, additional ones of these segments are energized. Preferably, the segments which comprise the bar graph display are selectively energized to provide a left-to-right shifting effect when the magnetic tape is driven in its fast forward operation, and these segments are energized to provide a right-to-left shifting effect when the tape is driven in its rewind operation. It will be appreciated that, if desired, other conventional segmentized displays may be utilized, as are known to those of ordinary skill in the art.

Display 24 also is provided with a suitable instruction indicator. This instruction indicator may be comprised of an instruction indicating lamp, LED, LCD element, or the like. Alternatively, an alphanumeric indication "INS" or "instruction" may comprise this instruction indicator. As will be described in greater detail below, when the tape is advanced or rewound to the location at which an instruction had been detected previously, this instruction indicator is energized to provide a suitable display to the operator. Additionally, after the tape has been scanned and the locations of instructions have been ascertained, the instruction indicator is suitably energized to indicate whether any messages awaiting transcription contain instructional information therein, and also whether the particular message that is in the process of being transcribed, or that is in position to be transcribed (e.g. the tape has been rewound or advanced to such a message) contains instructional information. For example, if the message then being transcribed contains an instruction (e.g. an instruction cue tone is recorded on the tape within the confines defined by this message), then the instruction indicator is energized to provide a flashing display representing that an instruction is included within this message. However, if the message then in position to be transcribed contains no instructional information but one or more subsequent messages which have not yet been reached for transcription contain an instruction, the instruction indicator remains energized in a steady state to apprise the operator accordingly. (Alternatively, the steady state display may represent an instruction present in the message then in position to be transcribed, and the flashing display may represent instructions in further messages.) Finally, if neither the message then in condition for transcription nor any subsequent messages awaiting transcription contain instructional information, the instruction indicator is extinguished, or blanked. This blanking of the instruction indicator occurs even if previously transcribed messages (i.e. those messages recorded on tape which already has passed the playback transducers) contain instructional information.

The numerical portion of display 24 may be reset to, for example, a display of "000" by the operation of a RESET switch 27. When a cassette is removed from device 10, a switch is actuated to clear a display memory that is used in conjunction with display 24, thus preparing that memory to store new information which, typically, is obtained upon scanning a new tape. Thus, information with respect to the locations of ends-of-messages and the occurrences of instruction signals (e.g. instruction cue tones) is cleared, or erased, upon the removal of the cassette.

The operation of display 24 in conjunction with the actuation of keyboard switches 18 and foot pedal switches 30 is controlled by a microprocessor. The microprocessor is commercially available and may be, for example, a Hitachi Model 44790, a National Semiconductor Model COPS 444L, an Intel Model 8085, or the like. Of course, the microprocessor is used in conjunction with suitable memory devices, such as a read only memory (ROM) and a random access memory (RAM). Flow charts representing the operation of the microprocessor for the purpose of controlling display 24 are set out in FIGS. 2A-2B, 3, 4 and 5. These flow charts represent individual subroutines of the overall program, or instructional routines, carried out by the microprocessor. Those subroutines which are not relevant to an understanding of the present invention are neither illustrated nor described.

Figure 2A:
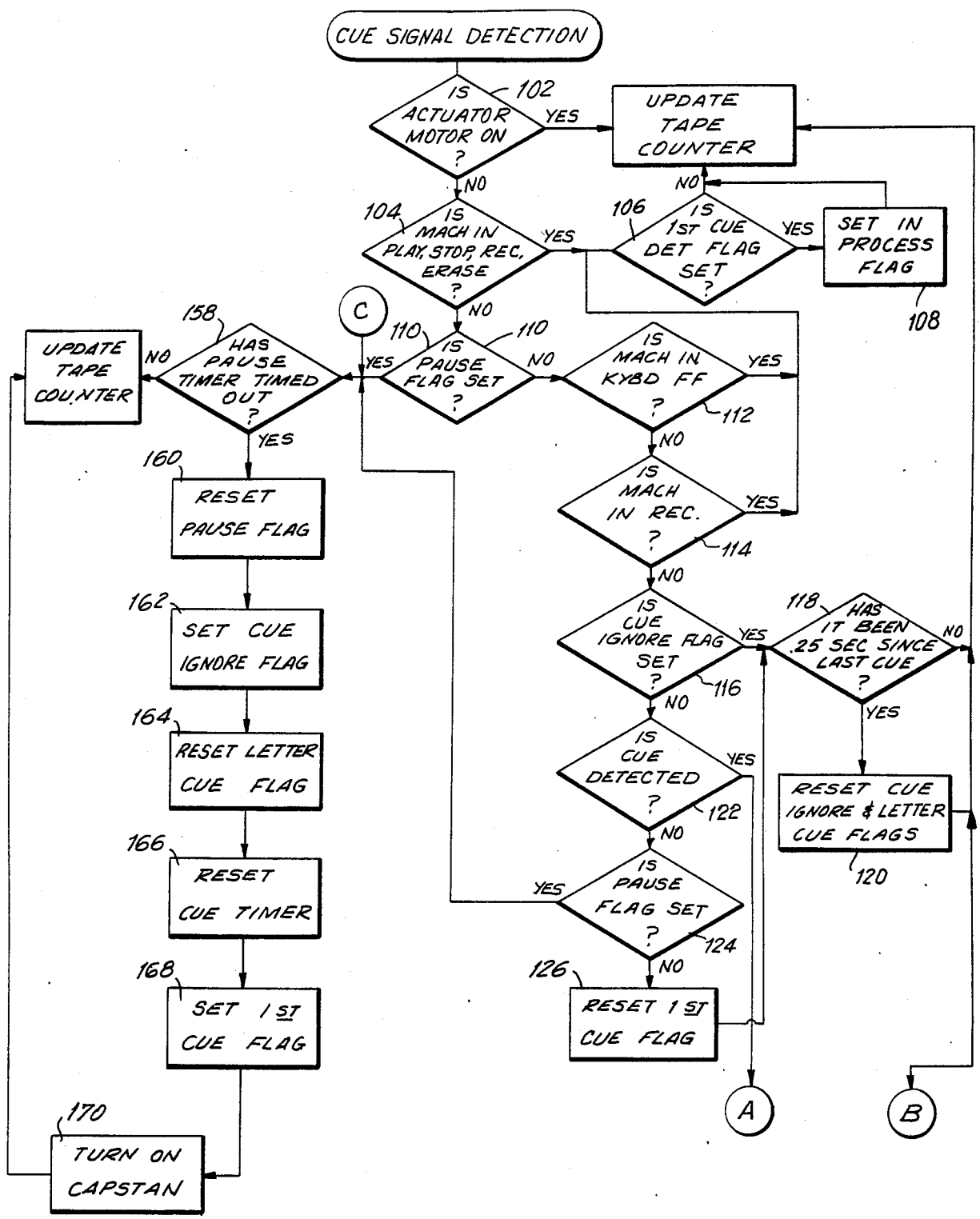
FIGS. 2A, 2B and 3-5 illustrate flow charts which are useful in understanding the present invention.
Figure 2B:
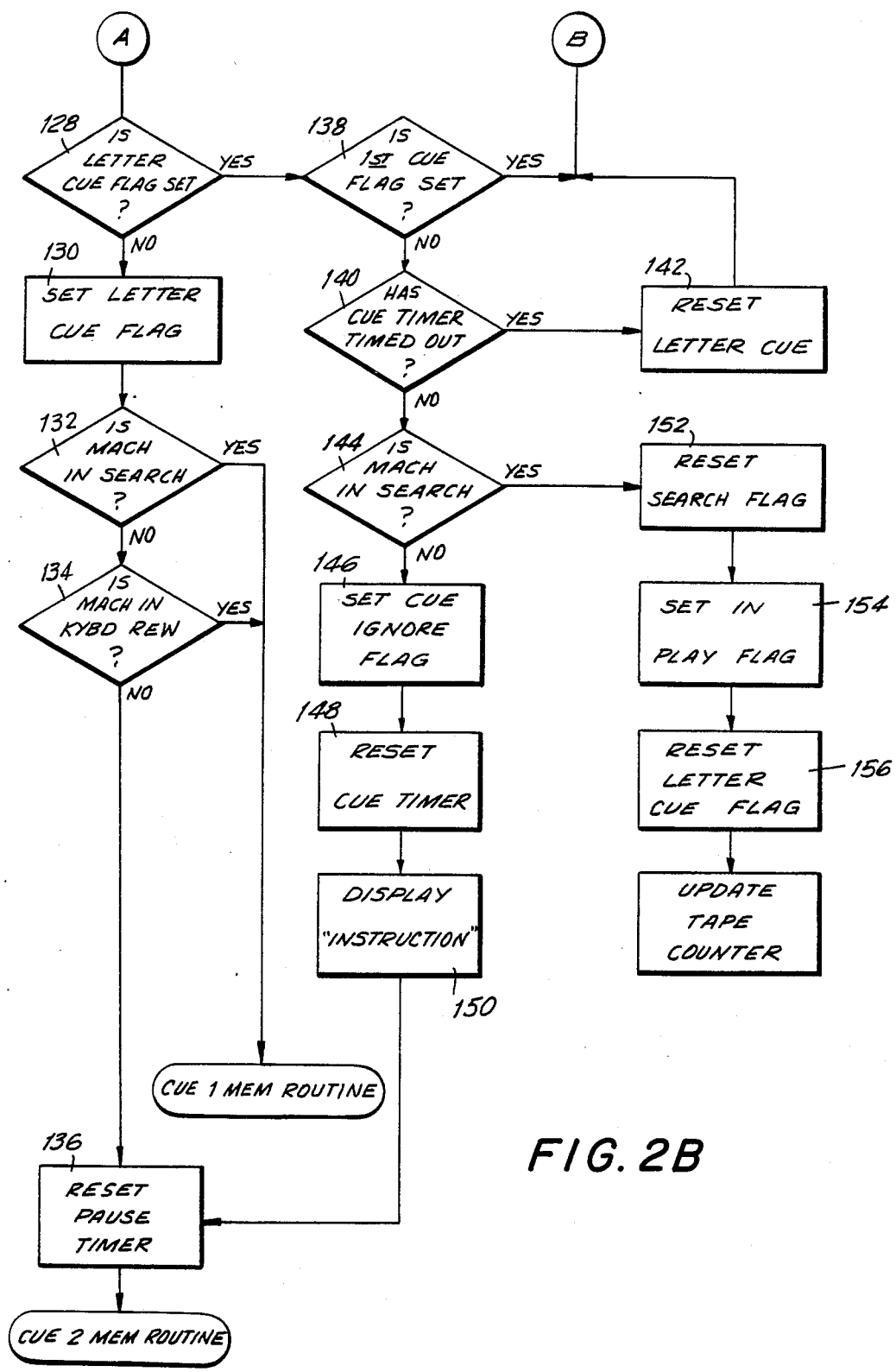

For convenience, the illustrated subroutines first will be described briefly, and an explanation of the operation of device 10, as controlled by these subroutines, will follow. Referring now to FIGS. 2A-2B, there is illustrated the flow chart representing the cue signal detection subroutine. This subroutine is operable to detect both end-of-message and instruction cue signals which previously have been recorded on the record medium. The cue signal detection subroutine may be executed periodically, or the microprocessor may "branch" to this subroutine in response to predetermined conditions. In either event, when executing the cue signal detection subroutine, inquiry 102 first is made as to whether the actuator motor is energized. In the preferred embodiment of device 10, when messages are transcribed from the record medium, the transducer, or transducers, is brought into magnetic coupling with the record medium in order to play back those messages. In other operating modes, the transducer is withdrawn from the record medium to allow that medium to advance or rewind rapidly. When the device is idle, the transducer is withdrawn, for example, to an intermediate location, to disengage the record medium. The mechanism by which the transducer is brought into and out of engagement, or magnetic coupling, with the record medium is an actuator, one example of which is described in copending application Ser. No. 434,249 now U.S. Pat. No. 4,547,821, filed Oct. 14, 1982 and assigned to the assignee of the present invention. It is noted here that, although the transducer is withdrawn from close coupling with the record medium during rewind and fast forward movement, there nevertheless remains sufficient coupling to permit the transducer to detect end-of-message and instruction cue signals recorded thereon. Alternatively, a separate cue signal transducer may be provided for this purpose.

If the answer to inquiry 102 is in the affirmative, that is, if the transducer is in the process of being brought into or out of engagement with the record medium, the microprocessor advances to the update tape counter subroutine, described below with respect to the flow charts shown in FIG. 5. However, if the answer to inquiry 102 is in the negative, the cue signal detection subroutine advances to inquiry 104 to ascertain whether device 10 is disposed in its playback, stop, record or erase modes of operation. If this inquiry is answered in the affirmative, the subroutine advances to inquiry 106 to determine if a first cue detect flag is set. As will be described below, this flag is set during the initial scanning of a record medium upon detecting a cue tone signal. In the preferred (but not limiting) embodiment, an end-of-message cue signal is recorded on the record medium in the form of a single tone burst and the instruction cue signal is recorded as a double burst of tone of the same frequency as the end-of-message tone. The two bursts of tone comprising the instruction cue signal are separated by approximately 500 milliseconds when the tape is transported at its normal record or playback speed. Upon detecting the single tone burst comprising the end-of-message cue signal, the first cue detect flag is set. Also, upon detecting the first of the double tone bursts comprising the instruction cue signal, this first cue detect flag is set. If the answer to inquiry 106 is in the negative, the microprocessor advances to the update tape counter subroutine. However, if this inquiry is answered in the affirmative, an in process flag is set, at 108, and then the update tape counter subroutine is executed.

As will become apparent from the ensuing description, the in-process flag is set upon terminating a tape scanning operation, either due to the rewinding of tape to its beginning or by the stopping of the tape by, for example, the actuation of STOP switch 50. The in process flag represents the completion of the scanning operation, which will not be resumed until the cassette presently loaded in cassette compartment 20 is ejected. Upon ejecting the cassette, both the first cue detect flag and the in process flag are reset.

If inquiry 104 is answered in the negative, the cue signal detection subroutine advances to inquire, at 110, whether a pause flag is set. As will be explained, this pause flag is set when the tape (or other record medium) is advanced or rewound at relatively high speed in response to the operation of foot pedal 30 until an end-of-message or instruction cue signal is detected. The pause flag also is set when the record medium is rewound to an instruction cue signal in response to the operation of keyboard REWIND switch 56 after the record medium has been scanned. If the pause flag is not set, inquiry is made, at 112, of whether device 110 is disposed in the fast forward mode, initiated by the operation of keyboard FAST FORWARD switch 58. This mode of operation, for convenience, is referred to as the keyboard fast forward mode. If inquiry 112 is answered in the affirmative, the subroutine advances to inquiry 106. However, if device 10 is not disposed in the keyboard fast forward mode, the subroutine advances to inquiry 114 to determine whether the device is disposed in a record mode. When configured as a transcription machine, the record mode is not selectable and, thus, inquiry 114 normally is answered in the negative.

If device 10 is not disposed in its record mode, the cue signal detection subroutine advances to 116 to inquire if a cue ignore flag is set. As will be described, this flag is set when an instruction cue signal is detected during scanning, fast forward or rewind modes of operation. If the cue ignore flag is set, the subroutine advances to inquire, at 118, whether 250 milliseconds have passed since detecting a cue signal. If this inquiry is answered in the affirmative, the cue ignore flag, and also a letter cue flag are reset, at 120, and the update tape counter subroutine is executed. It will be described below that the letter cue flag is set upon detecting either an end-of-message (also referred to herein as an end-of-letter) cue signal or the first tone burst of the instruction cue signal. However, if inquiry 118 is answered in the negative, the microprocessor merely advances to the update tape counter subroutine.

If the cue ignore flag is not set, that is, if inquiry 116 is answered in the negative, inquiry next is made, at 122, as to whether a cue signal is detected. This inquiry is answered in the affirmative if an end-of-message cue signal or if either of the tone bursts of the instruction cue signal is detected. If inquiry 122 is answered in the negative, the subroutine advances to inquiry 124 to determine if the pause flag is set. If the pause flag is not set, the first cue flag (which may or may not have been set) is reset, at 126, and the subroutine advances to inquiry 118. However, if the pause flag is set, the cue signal detection subroutine advances to inquiry 158, described below.

If a cue signal is detected, that is, if inquiry 122 is answered in the affirmative, inquiry next is made, at 128, as to whether the letter cue flag is set. It is recalled that this flag is set upon detecting a cue signal and, thus, inquiry 128 is answered in the affirmative if the second tone burst of the instruction cue signal is detected, or if the tape has advanced only a small amount, whereupon the cue signal which is detected is the very same cue signal which had been detected during the previous cycle through the cue signal detection subroutine. If inquiry 128 is answered in the negative, the letter cue flag is set, at 130, thus indicating that the cue signal which had been detected is the end-of-message (or end-of-letter) cue signal, and then the subroutine advances to inquiry 132.

Inquiry 132 determines whether device 10 is disposed in its search mode. As described above, this mode of operation is initiated in response to the actuation of SEARCH switch 54. If inquiry 132 is answered in the affirmative, the microprocessor advances to the cue memory subroutine illustrated in FIG. 3. However, if inquiry 132 is answered in the negative, the cue signal detection subroutine advances to inquire, at 134, whether device 10 is disposed in its keyboard rewind mode. If this inquiry is answered in the affirmative, that is, if REWIND switch 56 had been actuated, the microprocessor advances to the cue memory subroutine illustrated in FIG. 3. However, if inquiry 134 is answered in the negative, a pause timer is reset, at 136, and the cue memory subroutine illustrated in FIG. 4 is executed.

If, after detecting a cue signal, inquiry 128 had been answered in the affirmative, that is, if the cue signal had been detected while the letter cue flag had been set, inquiry is made, at 138, as to whether the first cue flag is set. The first cue flag differs from the first cue detect flag (mentioned above with respect to inquiry 106) and is set when an end-of-message cue signal is detected. If inquiry 138 is answered in the affirmative, the microprocessor advances to the update tape counter subroutine. However, if inquiry 138 is answered in the negative, inquiry next is made, at 140, as to whether a cue timer has timed out. This cue timer normally is reset in response to the detection of a cue signal, as will be described below with respect to the flow chart shown in FIG. 3, and will time out if another cue signal has not been detected within, for example, approximately 220 milliseconds. Normally, the two tone bursts comprising an instruction signal are separated by less than 220 milliseconds when the tape is driven at relatively high speed (e.g. during rewind or fast forward modes) and, thus, the cue timer will not time out by the time the second burst of an instruction cue signal is detected. However, if this cue timer has timed out at the time that a cue signal is detected, and prior to the resetting of the letter cue flag, the letter cue flag will be reset, at 142, and the update tape counter subroutine then will be executed.

If inquiry 140 is answered in the negative, the cue signal detection subroutine advances to inquiry 144 to determine if device 10 is disposed in its search mode. If this inquiry is answered in the negative, the cue ignore flag is set, at 146, the cue timer is reset, at 148, an instruction indication is displayed, at 150, the pause timer is reset, at 136, and the cue memory subroutine illustrated in FIG. 4 is executed. Thus, upon detecting an instruction from the magnetic tape during a tape scan or rewind operation an instruction indication is displayed.

If inquiry 144 had been answered in the affirmative, that is, if the instruction cue signal had been detected during the search mode of operation, this mode is interrupted, as by resetting the search flag at 152, an "in play" flag is set, at 154, which commands the playback mode of operation, the letter cue flag is reset, at 156, and the microprocessor advances to the update tape counter subroutine.

In the preceding discussion, the answers to inquiries 110 and 124 both have been in the negative. If, however, the pause flag is set, the cue signal detection subroutine advances to inquiry 158 to ascertain if the pause timer has timed out. This timer is reset, at 136, in response to the detection of a cue signal during, for example, a rewind operation initiated by the depression of rewind foot pedal switch 36, or a fast forward mode of operation initiated by the depression of fast forward foot pedal switch 38, or to a keyboard rewind operation is initiated following the scanning of tape. If inquiry 158 is answered in the negative, the microprocessor advances to the update tape counter subroutine. However, if this inquiry is answered in the affirmative, that is, if the pause timer has timed out, the pause flag is reset, at 160, and the cue signal detection subroutine advances to step 162. As represented by the flow chart shown in FIG. 2, the cue ignore flag is set, at 162, and the letter cue flag is reset, at 164. Additionally, the cue timer, which is used to determine whether a detected cue tone signal is an instruction cue signal, is reset, at 166, and the first cue flag is set, at 168. Also, the capstan (which, as will be described, had been de-energized) now is turned on, at 170, thus completing the "pause" operation. The microprocessor then executes the update tape counter subroutine.

Figure 3:
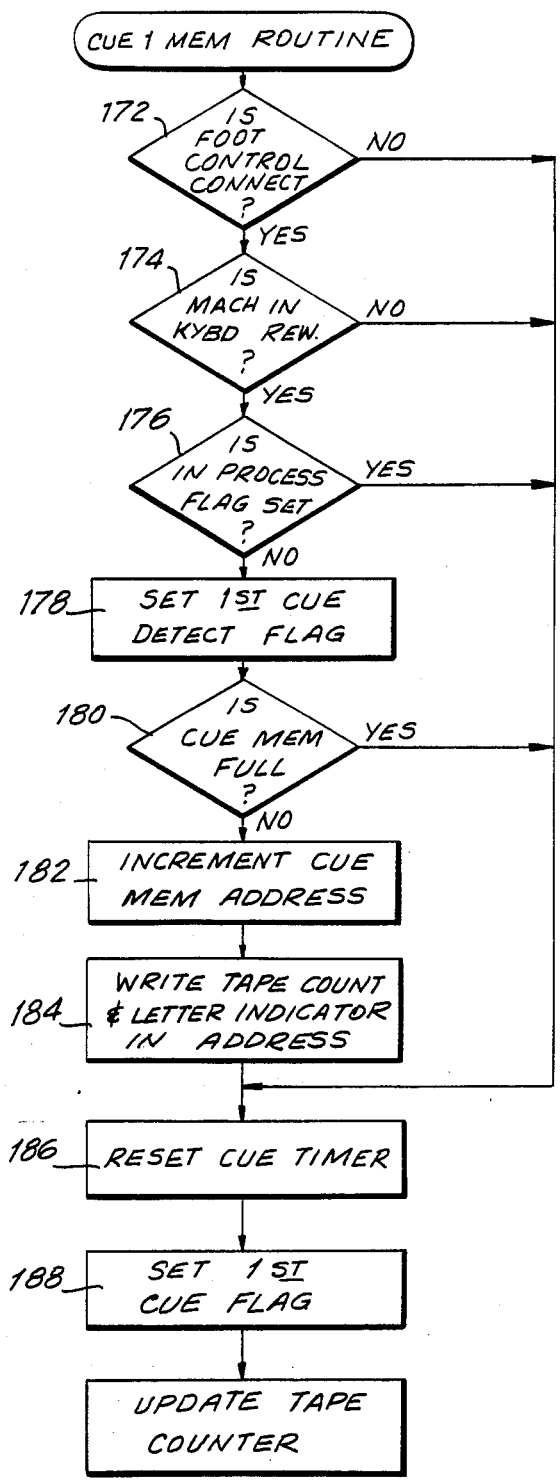
Figure 4:
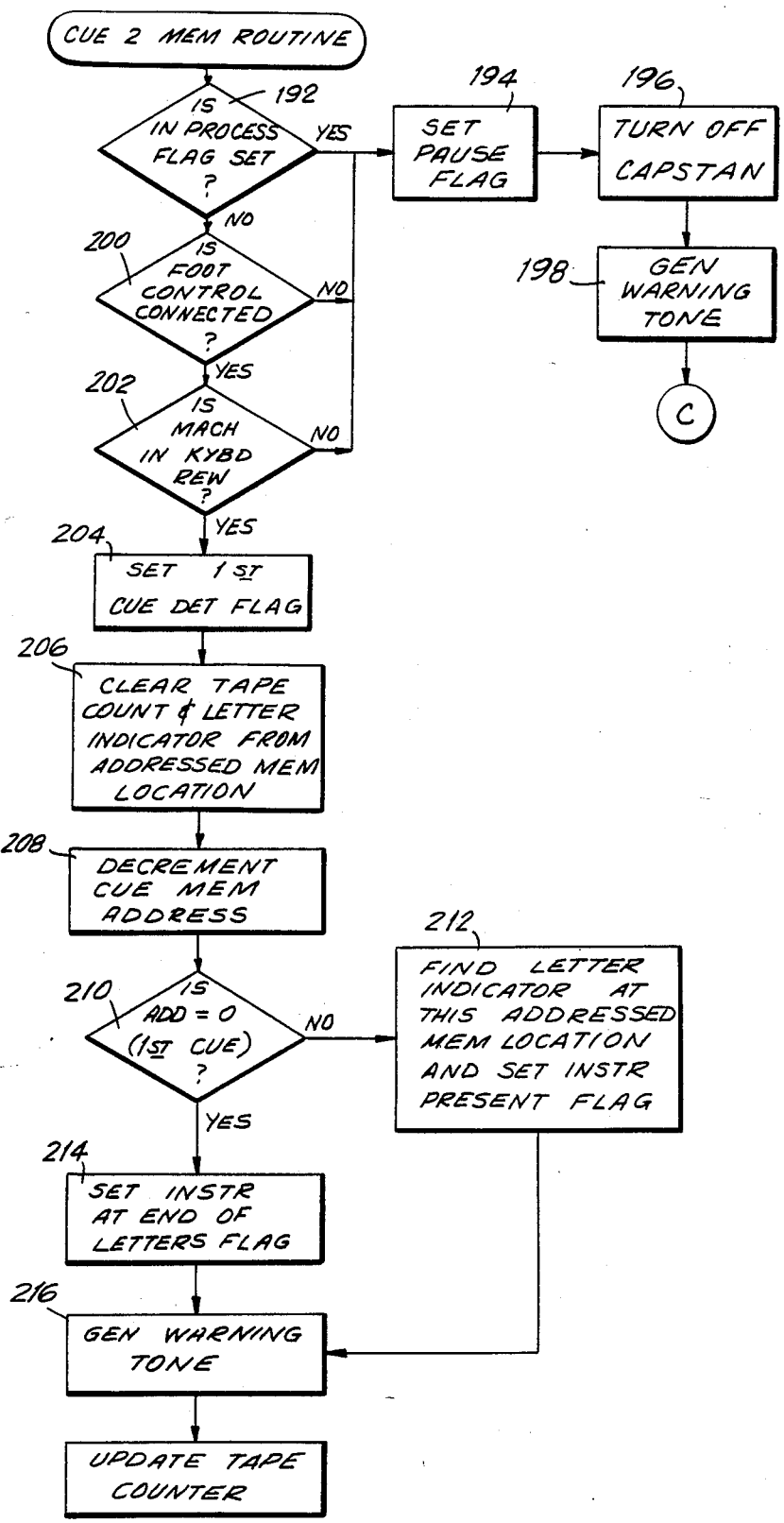

A first cue memory subroutine (whose flow chart is illustrated in FIG. 3) is executed when an end-of-message cue signal is detected during a keyboard rewind operation (mentioned above with respect to inquiry 134) or during a search operation (mentioned above with respect to inquiry 132). As illustrated in FIG. 3, this cue memory subroutine commences with inquiry 172 to determine whether foot pedal 30 is connected to device 10. It is appreciated that this inquiry is answered in the affirmative if the device is configured as a transcribe machine. However, if foot pedal 30 is not connected, the cue memory subroutine advances to reset the cue timer, at 186 and to set the cue flag, at 188, and then the update tape counter subroutine is executed.

Assuming that inquiry 172 is answered in the affirmative, inquiry then is made, at 174, to determine if device 10 is disposed in its keyboard rewind mode. If not, the cue timer is reset, at 186. However, if device 10 is operating in its keyboard rewind mode of operation, the cue memory subroutine advances to inquire, at 176, if the in process flag is set. It is recalled that this flag is set, at 108, upon the conclusion of a tape scan operation. If the in-process flag is set, the cue memory subroutine advances to reset the cue timer, at 186. However, if the in-process flag is not set, the first cue detect flag is set, at 178, and inquiry is made, at 180, as to whether the cue memory is full. One purpose of the first cue detect flag is to indicate that a cue signal has been detected (either an end-of-message cue signal or the first cue tone of an instruction cue signal) during a tape scan operation. Once a cue signal has been detected, the stopping of tape, either when the beginning of the tape is reached or in response to the actuation of keyboard STOP switch 50, results in the setting of the in process flag. As a result, the subsequent actuation of keyboard REWIND switch 56 will not have the effect of storing cue signal representations in the cue memory.

The cue memory is adapted to store the then present tape count representing the location of the tape at which an end-of-message cue signal is detected. As will be described, a tape counter is decremented when the tape is rewound and is incremented when the tape is advanced, this tape counter thus providing a substantially instantaneous indication of the present position of the tape as it moves past the transducer. In one embodiment, a predetermined number of addressable memory locations is provided (e. g. fifteen), each location being adapted to store the end-of-message tape count. If all of these predetermined addressable locations, that is, if all fifteen memory locations, have end-of-message tape counts stored therein, the cue memory is determined to be "full".

If inquiry 180 is answered in the negative, that is, if the cue memory is not full, the cue memory subroutine illustrated in FIG. 3 advances to step 182, whereat the cue memory address is incremented. In one embodiment, as the tape is rewound, the cue memory is addressed successively from a first location to the next, and so on, until the last (e. g. the fifteenth) memory location is addressed, this successive addressing being carried out when a cue signal is detected. When the tape is advanced, the address of the cue memory is decremented in response to each detected cue signal. It is seen that step 182 is carried out by the cue memory subroutine during a tape scan operation, that is, while the tape is being rewound.

After the cue memory address is incremented, the then existing tape count is written into the addressed location, at 184. Optionally, an end-of-message, or "letter" indicator also may be loaded into this addressed memory location. This letter indicator may be used to represent that the tape count identifies the location at which an end-of-message cue signal was detected. Alternatively, if a tape count is written into the cue memory in response only to detected end-of-message cue signals, the need for the letter indicator may be superfluous and, thus, the letter indicator may not be provided.

After the tape count is written into the addressed memory location, the cue memory subroutine advances to reset the cue timer, at 186, to set the first cue flag, at 188, and then to the update tape counter subroutine, discussed below with respect to the flow charts shown in FIG. 5.

From the flow chart of FIGS. 2A and 2B, it is seen that the second cue memory subroutine is carried out when a cue signal (either an end-of-message or instruction cue) is detected while device 10 is disposed in its foot pedal initiated rewind or fast forward mode, or when the second cue tone of an instruction cue signal is detected while the device is disposed in its keyboard rewind mode, its scan mode or its foot pedal initiated rewind or fast forward mode. This second cue memory subroutine is represented by the flow chart shown in FIG. 4. Initially, this subroutine inquires, at 192, as to whether the in process flag is set. If this inquiry is answered in the affirmative, that is, if a cue tone is detected during a mode other than a scan mode, this cue memory subroutine advances to set the pause flag, at 194, to de-energize the capstan motor, at 196, thus stopping the tape, and to generate a warning tone, at 198, thus apprising the operator that a cue tone has been reached. Thereafter, the microprocessor advances to inquiry 158 of the cue signal detection subroutine, described above.

However, if the in process flag is not set upon detecting a cue tone, this cue memory subroutine advances to inquiry 200 to ascertain if foot pedal 30 is connected to device 10. If not, that is, if the device is not configured as a transcribe machine, the subroutine advances to step 194. However, if the foot pedal is connected to device 10, the cue memory subroutine advances to inquire, at 202, whether the device is disposed in its keyboard rewind mode of operation. This inquiry will be answered in the negative if the cue signal has been detected in response to a foot pedal initiated rewind or fast forward mode, whereupon the subroutine advances to step 194. However, if the cue signal has been detected while device 10 is disposed in its keyboard rewind mode, the subroutine advances to step 204 to set the first cue detect flag. Normally, this first cue detect flag will already be set by the cue memory subroutine illustrated in FIG. 3, which subroutine normally is executed before the cue memory subroutine illustrated in FIG. 4. That is, step 204 in the flow chart shown in FIG. 4 is reached upon detecting the second cue tone included in an instruction cue signal. The first cue detect flag will be set in response to the detection of the first cue tone included in this instruction cue signal, as is apparent from the flow chart of FIG. 3. Hence, step 204 may be omitted because of redundancy, if desired.

In any event, if inquiry 202 is answered in the affirmative, the cue memory subroutine advances to step 206 to clear the tape count (and optional letter indicator) that had been loaded into the cue memory location that presently is being addressed. It is recalled, from the flow chart shown in FIG. 3, that the detection of a cue tone results in loading into the cue memory the tape count representing the location at which the cue signal is recorded. If this cue signal constitutes the end-of-message cue signal, then the loaded tape count is retained. However, if the detected cue signal constitutes the first cue tone of the instruction cue signal, then, upon detecting the second cue tone therein, the tape count should be erased because that count does not represent the location of an end-of-message. Rather, that count represents the location of a recorded instruction cue signal; and in the embodiment described herein, the locations, or tape counts, of instruction cue signals are not stored. Of course, in an alternative embodiment, such instruction locations may be stored, if desired.

After clearing the tape count from the addressed memory location, thus correcting the initial indication that the detected cue signal was an end-of-message cue signal, the cue memory address is decremented, at 208. It is recalled that, when the tape is rewound during a scan operation, the cue memory address is incremented in response to each detected end-of-message cue signal. Upon detecting the first cue tone included in an instruction cue signal, the cue memory address had been incremented because this first cue tone had been interpreted erroneously as an end-of-message cue signal. Upon detecting the second cue tone within the proper time interval, it is determined that the cue signal is, in fact, an instruction cue signal and not an end-of-message cue signal. Hence, the incrementing of the cue memory address was improper and must be corrected. Step 208 carries out this correction by now decrementing the cue memory address. Thus, the cue memory location now addressed is the location in which is stored the tape count identifying the end of the message which contains the now-detected instruction.

After decrementing the cue memory address, the cue memory subroutine advances to inquiry 210 to determine if the cue memory address is equal to zero. Initially, the cue memory address generator is preset to zero and is incremented sequentially in response to each detected end-of-message cue signal. If, after decrementing, as in step 208, the cue memory address now is equal to zero, it is seen that the detected instruction cue signal is the first cue signal to be detected on the tape. It is advantageous to apprise the operator that the last cue signal which had been recorded by the author was not an end-of-message cue signal, as normally is expected, but, rather, is an instruction cue signal. Accordingly, upon answering inquiry 210 in the affirmative, an "instruction at end of letters" flag is set, at 214, and a warning tone is generated, at 216. The update tape counter subroutine then is carried out. However, if inquiry 210 is answered in the negative, that is, if the cue memory address is not equal to zero, an "instruction present" flag is inserted at 212 into the addressed cue memory location, thus indicating that, in the message which ends at the location whose tape count is stored in this cue memory address, an instruction is included. To prevent ambiguities or a possible error, it may be desirable to store a letter indicator with the tape count in the cue memory. The use of such a letter indicator permits some assurance that the stored tape count represents the location of an end of message and not something else. Hence, step 212 may be augmented by the step of clearing a letter indicator from the addressed memory location, and inserting the "instruction present" flag at a suitable site at this location.

As an alternative, a separate instruction indicator register may be provided to store "instruction present" flags. This instruction indicator register may be addressable concurrently with the addressing of the cue memory in which are stored tape counts (and, optionally, letter indicators). However, it is preferred that the cue memory locations include an "instruction present" bit which, when set, represents the inclusion of instructional information in the message whose end is represented by the stored tape count, this flag remaining reset if the message does not contain an instruction.

After inserting (or setting) the "instruction present" flag, the cue memory subroutine advances to step 216.

Figure 5:
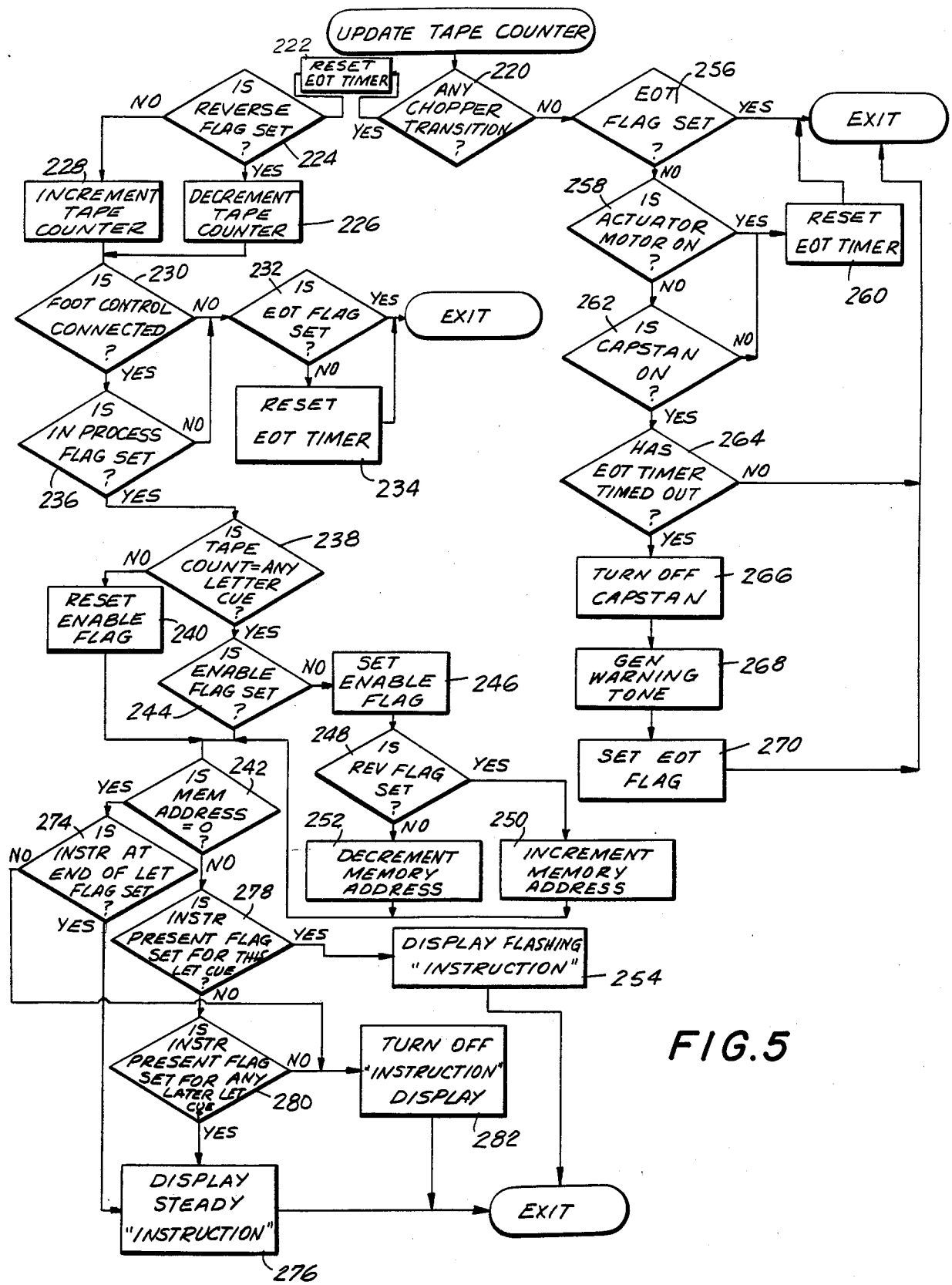

Before describing the manner in which the aforementioned subroutines operate during various operating modes of the device, a description of the update tape counter subroutine is provided in conjunction with the flow chart thereof, set out in FIG. 5. Briefly, the purpose of the update tape counter subroutine is to increment or decrement a tape counter as the magnetic tape is advanced or rewound, respectively, in response to pulse signals that are generated as incremental portions of the tape are moved. In the embodiment wherein tape moves between the supply and take-up reel of a tape cassette, a so-called chopper wheel is mechanically coupled to one or the other of these reels so as to be rotatable therewith. Rotation of the chopper wheel may be detected by optical means, such as described in U.S. Pat. No. 4,200,893, or by magnetic means, as described in U.S. Pat. No. 4,410,923, or by other means to generate a series of pulses as the magnetic tape is driven. Such pulses are counted, and the accumulated count represents the particular position of the tape relative to the transducer. Stated otherwise, the accumulated count represents the amount of tape which has been transported.

Another purpose of the update tape counter subroutine is to determine when a message containing instructional information is reached, either during a rewind operation, a fast forward operation or a playback operation. Still another purpose of this subroutine is to detect when the tape has been advanced to its end or is otherwise unable to be advanced further.

More specifically, the update tape counter subroutine is carried out by inquiring, at 220, whether any chopper pulse transitions have been detected. As mentioned above, chopper pulses are generated by suitable means as the tape is rewound or advanced. A chopper pulse transition is detected by sensing a changeover in the chopper pulse generator from one voltage level to another. When such a changeover is sensed, inquiry 220 is answered in the affirmative and an end-of-tape (EOT) timer is reset, at 222. It will be seen that this EOT timer is reset in response to each chopper pulse transition, and in the absence of such a transition the timer is not reset but, rather, continues to "run" until it times out. As will be described, the end of tape is indicated when the EOT timer times out.

After resetting the EOT timer, inquiry is made, at 224, of whether the reverse flag is set. When the tape is advanced, the reverse flag is not set. Conversely, when the tape is rewound, this flag is set and inquiry 224 is answered in the affirmative. In response to an affirmative answer to inquiry 224, the tape counter is decremented by one count, at 226. However, if the reverse flag is not set, the tape counter is incremented by one count, at 228. Thus, it is seen that each chopper pulse transition serves to increment or decrement the tape counter, depending upon the direction in which the tape is driven.

After the tape counter is updated, at 226 or 228, inquiry is made, at 230, of whether foot pedal 30 is connected to device 10. If this inquiry is answered in the negative, the update tape counter subroutine advances to inquire, at 232, if the EOT flag is set. This flag is set in the event that the EOT timer times out. If inquiry 232 is answered in the affirmative, the microprocessor exits from the update tape counter subroutine and continues with its program. However, if inquiry 232 is answered in the negative, the EOT timer is reset, at 234, and then this update tape counter subroutine is exited.

If inquiry 230 is answered in the affirmative, the update tape counter subroutine advances to inquiry 236 to ascertain if the in process flag is set. If not, the subroutine advances to inquiry 232. However, if the in process flag is set, the subroutine advances to inquire, at 238, if the then present tape count is substantially equal to any tape count stored at any location of the aforedescribed cue memory. Stated otherwise, inquiry 238 ascertains if the tape has been advanced or rewound to the location at which an end-of-message cue signal is recorded. This may be determined by reading out the contents of the cue memory and comparing the read out contents to the count of the tape counter. If an end of a message has been reached, inquiry is made, at 244, if an enable flag is set. If this inquiry is answered in the negative, the enable flag is set, at 246, and inquiry is made, at 248, if the reverse flag is set. If inquiry 248 is answered in the affirmative, that is, if the tape is in the process of being rewound, the update tape counter subroutine advances to step 250 to increment the cue memory address. From the flow chart of FIG. 3, it is recalled that, as the tape is being rewound, the cue memory address is incremented. Likewise, during the update tape counter subroutine, if the reverse flag is set, the cue memory address is incremented. However, if the reverse flag is not set, that is, if inquiry 248 is answered in the negative, the cue memory address is decremented, at 252. Thus, upon reaching an end-of-message cue signal on the tape, the cue memory address is either incremented or decremented, depending upon whether the end-of-message cue signal has been reached by means of rewinding or advancing the tape. The update tape counter subroutine then advances to inquiry 242.

If the then present tape count is equal to any tape count stored in the cue memory, and if inquiry 244 is answered in the affirmative, then the update tape counter routine merely advances to inquiry 242. However, if the tape has not been driven to the location at which an end-of-message cue signal is recorded, that is, if inquiry 238 is answered in the negative, the enable flag is reset, at 240, and the subroutine advances to inquiry 242.

Inquiry 242 ascertains if the cue memory address is equal to zero. If this inquiry is answered in the affirmative, inquiry is made, at 274, if the "instruction at end of letter" flag is set. From the flow chart discussed above with respect to FIG. 4, it is recalled that this flag is set during a tape scan operation if the first cue signal encountered on the tape is an instruction cue signal rather than the normally expected end-of-message cue signal. If inquiry 274 is answered in the affirmative, a steady state "instruction" indication is provided by display 24, as represented by step 276. Thereafter, the microprocessor exits from the update tape counter subroutine.

However, if inquiry 274 is answered in the negative, the "instruction" indication by display 24 is extinguished.

If the presently generated cue memory address is not equal to zero, as is normally expected, the update tape counter subroutine advances to inquiry 278 to ascertain if the "instruction present" flag is set in the cue memory location now being addressed. For example, at least a portion of the contents (e. g. the "instruction present" flag) of the addressed memory location is read out and sensed. It is appreciated that inquiry 278 is answered in the affirmative if the message then in position to be played back, or then in the process of being played back, contains an instruction. If this inquiry is answered in the affirmative, the "instruction" indication is flashed, as at 254, by display 24. However, if inquiry 278 is answered in the negative, that is, if the message then being transcribed or then in position to be transcribed (i. e. the message to which the tape has been rewound or advanced) does not contain an instruction, the update tape counter subroutine advances to inquiry 280 to ascertain if an "instruction present" flag is set in any cue memory location having a lower address (e. g. the contents of these memory locations are read out and examined for an "instruction present" flag). It is recalled that, as the tape is advanced, the cue memory address is decremented in response to each detected end-of-message cue signal. Thus, if instructional information is included in any subsequent message that has not yet been reached for play back, that is, if any later messages have instructions recorded therein, inquiry 280 is answered in the affirmative. As a result, a steady state instruction indication is displayed. However, if inquiry 280 is answered in the negative, that is, if neither the message then in position to be played back nor any subsequent, later-recorded messages, contains instructional information therein, the instruction indication provided by display 24 is extinguished.

Returning to the initial inquiry 220 of the update tape counter subroutine, if this inquiry is answered in the negative, that is, if a chopper pulse transition has not been sensed, the update tape counter subroutine advances to inquire, at 256, if the EOT flag is set. If it is, that is, if the end of the tape has been reached or if the tape cannot be advanced further because of, for example, a jam or other malfunction, the microprocessor exits from this subroutine. However, if inquiry 256 is answered in the negative, the update tape counter subroutine advances to inquiry 258 to ascertain if the actuator motor is operating. If it is, that is, if the transducer is being brought into or out of magnetic coupling with the tape, the EOT timer is reset, at 260, whereupon the microprocessor exits from this subroutine.

However, if inquiry 258 is answered in the negative, the update tape counter subroutine advances to inquire, at 262, if the capstan motor is operating. If this inquiry is answered in the negative, thus indicating that the operator has elected to stop the tape, the EOT timer is reset. But, if inquiry 262 is answered in the affirmative, the update tape counter subroutine advances to inquire, at 264, if the EOT timer has timed out. If this inquiry is answered in the negative, the microprocessor merely exits from this subroutine. However, if the EOT timer has timed out, that is, if two successive chopper pulse transitions have not occurred within a predetermined time interval (e.g. approximately 3-4 seconds), the capstan motor is turned off, at 266, a warning tone is generated, at 268, to apprise the operator that the end of the tape has been reached, and the EOT flag is set, at 270. Thereupon the microprocessor exits from this subroutine.

Figure 6:
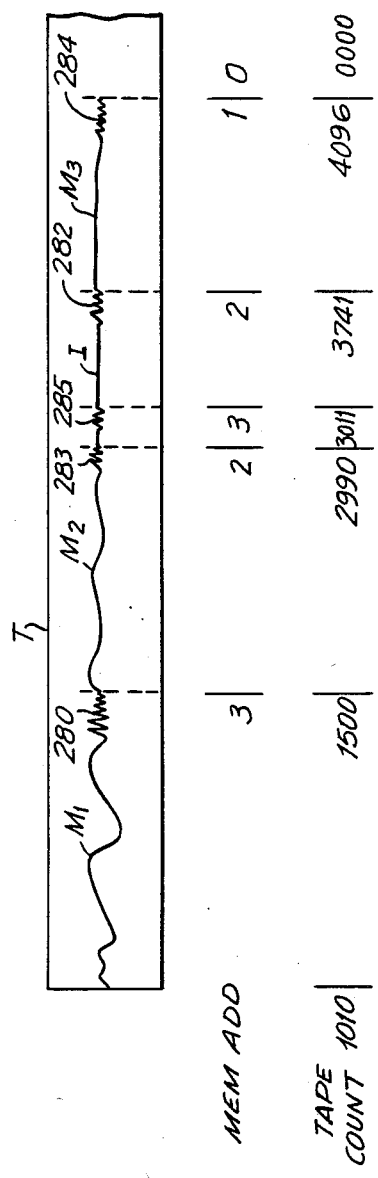
FIG. 6 is a schematic representation of the recording of informational and instructional messages, as well as cue tones, in a common track of a magnetic tape, and will be useful in understanding the present invention.

The manner in which the subroutines discussed above cooperate during typical transcription operations now will be described, in conjunction with the schematic representation of a segment of tape T shown in FIG. 6. The information recorded on the tape of FIG. 6 is represented schematically as three separate messages $M_1$, $M_2$ and $M_3$, with the end of message $M_1$ being represented by an end-of-message cue signal 280, the end of message $M_2$ being represented by an end-of-message cue signal 282 and the end of message $M_3$ being represented by an end-of-message cue signal 284. In the illustrated embodiment, it is assumed that each end-of-message cue signal is comprised of a tone pulse of predetermined duration and frequency. As mentioned above, other representations may be utilized to designate the end of a message. Also, it is assumed that each end-of-message cue signal is recorded in the same track as the audio messages.

It is assumed, in the embodiment represented schematically in FIG. 6, that message $M_2$ contains instructional information I therein. This instructional information also is represented as being recorded in the same track as the primary message $M_2$. The beginning of the instructional information I is represented by an instruction cue signal which is comprised of two separate tone pulses 283 and 285, each pulse being of the same duration as the tone pulse which comprises the end-of-message signal, the frequency of each of these tone pulses being the same, and the time separation of tone pulses 283 and 285 being a predetermined amount. As an example, when tape T is rewound or advanced at a relatively high speed, tone pulse 285 commences within 0.2 seconds from the commencement of tone pulse 283.

Let it be assumed that tape T is loaded into device 10 and then initially is scanned to ascertain the locations thereon of each end-of-message and instruction cue signal. It is assumed that messages $M_1$, $M_2$ and $M_3$ have been dictated from the beginning of the tape, and message $M_3$ ends at some arbitrary location along the length of the tape, the end of message $M_3$ being designated by end-of-message signal 284. On loading tape T into device 10, the tape counter is reset to a count of, for example [0000], and the cue memory address likewise is reset to, for example, address number zero. Now, keyboard REWIND switch 56 is actuated.

The microprocessor (or microprocessors) included in device 10 carries out its program and, ultimately, executes the cue signal detection subroutine illustrated in FIGS. 2A and 2B. Normally, the transducer is not in close magnetic coupling with the tape during rewind (although it is close enough to detect cue signals) and inquiry 102 is answered in the negative. It has been assumed that keyboard REWIND switch 56 has been actuated and inquiry 104 also is answered in the negative. At this time, the pause flag is not set; and device 10 is not disposed in its keyboard fast forward mode or in its record mode. The cue ignore flag is not set, and the cue signal detection subroutine now advances to inquiry 122. If end-of-message cue signal 284 (FIG. 6) had been the last signal recorded on tape T, following which the tape had been unloaded from its recorder, this cue signal will be detected almost immediately upon rewinding the tape. For the purpose of the present discussion, let it be assumed that this cue signal is detected. Hence, inquiry 122 is answered in the affirmative.

Since end-of-message cue signal 284 is the first cue signal to be detected, inquiry 128 is answered in the negative. Accordingly, the letter cue flag is set.

Proceeding with the cue signal detection subroutine, inquiry 132 is answered in the negative and inquiry 134 is answered in the affirmative. Thus, the microprocessor advances to the cue memory subroutine illustrated in FIG. 3.

In executing this subroutine, inquiry 172 is answered in the affirmative, as is inquiry 174. At this time, the in process flag is not set and, thus, the first cue detect flag is set, at 178. The cue memory is not full and, consequently, the cue memory address now is incremented. As mentioned above, when tape T is loaded into device 10, the tape count is reset to the count [0000] and the cue memory address is reset to address zero. Hence, by incrementing the cue memory address, this address is changed from zero to 1, as represented by the "MEM ADD" scale of FIG. 6.

The tape count, which is decremented when tape T is rewound, now is written into memory address 1. It is assumed that tape T has been rewound sufficiently to decrement the tape count to the count of [4096] at the time that end-of-message cue signal 284 is detected. Thus, a tape count of [4096] is stored at memory location 1 and, optionally, a letter indicator also is stored at this location. The cue timer now is reset, the first cue flag is set and the update tape counter subroutine is executed.

Turning to FIG. 5, as tape T is rewound, the update tape counter subroutine is carried out. Chopper pulse transitions will occur as the tape is rewound, these chopper pulse transitions thus serving to reset the EOT timer. As long as chopper pulse transitions are detected, the EOT timer is prevented from timing out.

Since tape T is in the process of being rewound, inquiry 224 is answered in the affirmative and, thus, the tape counter is decremented. As mentioned above, it is assumed that the count of the tape counter has been decremented from count [0000] to the count [4096] at the time that end-of-message cue signal 284 is detected.

Continuing with the update tape counter subroutine, inquiry 230 is answered in the affirmative and inquiry 236 is answered in the negative. Since the EOT flag is not set, the EOT timer is reset, and the microprocessor exits from the update tape counter subroutine.

It will be appreciated that the update tape counter subroutine is executed to the extent that the EOT timer is reset and the tape counter is decremented in response to each detected chopper pulse transition so long as tape T is rewound.

Let it be assumed that, although tape T continues to be rewound and is not stopped upon detecting end-of-message cue signal 284, the cue signal detection subroutine is executed once again while this very same end-of-message cue signal 284 remains detected. Accordingly, the subroutine represented by the flow charts of FIGS. 2A and 2B is repeated. Inquiries 102, 104, 110, 112, 114 and 116 all are answered in the negative. Since the same end-of-message cue signal is detected, inquiry 122 is answered in the affirmative. Advancing to inquiry 128, it is recalled that, during the last pass through this subroutine, the letter cue flag had been set, at 130. Hence, inquiry 128 is answered in the affirmative. Also, when the cue memory routine illustrated in FIG. 3 had been executed previously, the first cue flag had been set, at 188. Consequently, inquiry 138 is answered in the affirmative. Therefore, the cue signal detection subroutine cycles to the update tape counter subroutine, which has been described above. That is, the update tape counter subroutine is executed to the extent that the tape counter is decremented in response to each sensed chopper pulse transition as tape T continues to be rewound. Since the in process flag has not been set, the update tape counter subroutine cannot advance past inquiry 236.

It is appreciated that, although the cue signal detection subroutine is carried out again, as a result of the continued detection of end-of-message cue signal 284, the cue memory subroutine illustrated in FIG. 3 is not executed. Rather, the cue signal detection and update tape counter subroutines are recycled as discussed above.

Eventually, tape T is rewound sufficiently such that end-of-message cue signal 284 no longer is detected. Hence, upon the next cycle through the cue signal detection subroutine, inquiries 102, 104, 110, 112, 114, 116 and 122 all are answered in the negative. Since the pause flag is not set, the first cue flag, which had been set by the cycle through the cue memory subroutine shown in FIG. 3, now is reset. It is assumed that this cycle through the cue signal detection subroutine is carried out promptly and, thus, inquiry 118 is answered in the negative. Accordingly, the update tape counter subroutine, discussed above, is recycled.

The foregoing cycle through the cue signal detection subroutine repeats until the timer, such as the cue timer (which had been reset at 186 in the cue memory subroutine shown in FIG. 3) indicates that 0.25 seconds have passed since the preceding cue signal (i. e. end-of-message cue signal 284) was detected. At that time, inquiry 118 is answered in the affirmative and the cue ignore flag (which had not been set) is reset and the letter cue flag also is reset. The update tape counter subroutine then is carried out.

Now, the cue signal detection subroutine cycles through inquiries 102, 104, 110, 112, 114, 116, 122 and 124, along with step 126, inquiry 118, step 120 when the cue signal detection subroutine is called upon for execution. This cycling continues until end-of-message cue signal 282 is detected. It is appreciated, from the schematic illustration in FIG. 6, that cue signal 282 designates the end of message $M_2$. It also is seen that this message contains an instruction signal I.

Upon the next cycle through the cue signal detection subroutine, inquiries 102, 104, 110, 112, 114 and 116 all are answered in the negative, and inquiry 122 now is answered in the affirmative. Since the letter cue flag is not set (inquiry 128), this flag now is set and, since device 10 is not disposed in its search mode but is operating in its keyboard rewind mode, the cue memory subroutine illustrated in FIG. 3 is carried out.

In executing this cue memory subroutine, inquiries 172 and 174 both are answered in the affirmative, inquiry 176 is answered in the negative, the first cue detect flag is set (although it had not been reset from its previous setting), inquiry 180 is answered in the negative and the cue memory address now is incremented from address 1 to address 2.

The tape count, which had been decremented by the update tape counter subroutine, now is loaded into cue memory location 2. As represented by the tape count scale of FIG. 6, it is assumed that this tape count had been decremented to the count [3741], and it is this count, which represents the location along tape T at which end-of-message cue signal 282 is recorded, that is loaded into cue memory location 2. Thereafter, the cue timer is reset, the first cue flag is set and the update tape counter subroutine is carried out once again. This subroutine, together with the cue signal detection subroutine discussed in detail above, are repeated cyclically as tape T continues to be rewound. Of course, after end-of-message cue signal 282 passes beyond the cue signal detecting transducer, and after the cue timer has timed out, the letter cue flag and the first cue flag both are reset, as described above.

Let it now be assumed that tape T has been rewound such that cue tone 285 of the illustrated instruction cue signal is detected. Cue tone 285 is interpreted in the same manner as end-of-message cue signals 282 and 284 had been interpreted, and as had been discussed above. Accordingly, the letter cue flag is set (at step 130), the cue memory address is incremented from address 2 to address 3 (at 182), and the then present tape count, which is assumed herein to be [3011], is loaded into cue memory location 3. Thereupon the cue timer is reset and the update tape counter subroutine is executed.

After tape T has been rewound sufficiently such that cue tone 285 no longer is detected, but prior to the detection of cue tone 283, the execution of the cue signal detection subroutine results in the resetting of the first cue flag, at 126, and inquiry 118 is answered in the negative. Eventually, and prior to the timing out of the cue timer, the second cue tone 283, which is included in the instruction cue signal, is detected. The next cycle through the cue signal detection subroutine finds inquiries 102, 104, 110, 112, 114 and 116 all answered in the negative, and inquiry 122 now is answered in the affirmative. Since the letter cue flag is set but the first cue flag is not (it had been reset at 126 during a preceding cycle through this subroutine), the cue signal detection subroutine advances to inquiry 140. As mentioned above, it is assumed that the cue timer has not timed out and, thus, inquiry 140 is answered in the negative. Inquiry 144 also is answered in the negative and, thus, the cue ignore flag is set, the cue timer is reset and the "instruction" indication is displayed. Thus, the operator is apprised that an instruction has been detected. The pause timer then is reset, at 136, and the cue memory subroutine illustrated in FIG. 4 is carried out.

Inquiry 192 is answered in the negative, but inquiries 200 and 202 both are answered in the affirmative. The first cue detect flag now is set but, as mentioned above, this step may be omitted because the first cue detect flag had been set during a previous execution of the cue memory subroutine shown in FIG. 3, and had not been reset since then.

Next, the tape count [3011] which had been stored in memory location 3 is cleared therefrom. Also, if a letter indicator had been stored at cue memory location 3, this letter indicator also is cleared. Thus, the storage of end-of-message information at cue memory location 3 is deleted. Then, the cue memory address is decremented from address 3 to address 2. Inquiry 210 is seen to be answered in the negative; and the "instruction present" flag now is set, or inserted, into cue memory location 2. Thus, cue memory location 2 stores a representation of the fact that the message which ends at tape count [3741], that is, message $M_2$, contains an instruction I.

Then, to provide further indication of the detection of this instruction, a warning tone is generated. The update tape counter subroutine then is executed once again.

The next cycle through the cue signal detection subroutine arrives at inquiry 116 which now is answered in the affirmative. It is recalled that the cue ignore flag had been set at 146 during a previous cycle through this subroutine. During that same preceding cycle through this subroutine, the cue timer had been reset. It is assumed, therefore, that inquiry 118 now is answered in the negative.

This cycle through the cue signal detection subroutine is repeated until the cue timer times out. At that time, inquiry 118 is answered in the affirmative and the cue ignore and letter cue flags both are reset. Thereafter, each cycle through the cue signal detection subroutine follows inquiries 102, 104, 110, 112, 114, 116, 122 and 124, step 126, inquiry 118 and step 120.

When end-of-message cue signal 280 is reached, it is appreciated that the cue memory address is incremented from address 2 to address 3 and the tape count [1500] present at the detection of end-of-message signal 280 is loaded into cue memory location 3.

The cue signal detection and update tape counter subroutines continue to cycle in the manner described above, until the beginning of the tape is reached. At that time, when the update tape counter subroutine illustrated in FIG. 5 next is executed, inquiry 220 will be answered in the negative. The EOT flag is not set and the actuator motor is not operating. However, the capstan is energized, but the EOT timer has not timed out. The microprocessor then exits from this subroutine.

Each subsequent cycle through the update tape counter subroutine follows the path mentioned above. Ultimately, since the EOT timer is not reset, because of the absence of chopper pulse transitions, inquiry 264 is answered in the affirmative. At that time, the capstan motor is deenergized, a warning tone is generated to apprise the operator that the beginning of tape has been reached, and the EOT flag is set. A suitable timer (not shown or represented) then is actuated to "time out", whereupon the device is changed over to its stop mode.

Let it now be assumed that device 10 is disposed in its playback mode by, for example, the depression of play foot pedal switch 34. In order to play back the messages recorded on tape T, the actuator must be energized to bring the transducer into good magnetic coupling with the tape. When the cue signal detection subroutine is carried out, inquiry 102 is answered in the affirmative until the transducer is disposed at its playback position. Likewise, when the update tape counter subroutine is carried out (FIG. 5), inquiries 220 and 256 are answered in the negative, but inquiry 258 is answered in the affirmative until the transducer is properly positioned.

When the transducer is positioned for a playback operation, tape T is advanced and the tape counter is incremented in response to each sensed chopper pulse transition during the update tape counter subroutine. When the cue signal detection subroutine is carried out, inquiry 104 is answered in the affirmative and, since the first cue detect flag had been set during the tape scanning operation, the in process flag now is set. It is appreciated that, when the beginning of the tape is reached, device 10 is changed over to its stop mode which, from the flow chart shown in FIGS. 2A-2B, results in the setting of the in process flag. That is, inquiry 104 is answered in the affirmative, inquiry 106 also is answered in the affirmative and the in process flag is set, at 108. Further cycling through the cue signal detection subroutine follows the path formed by inquiries 102, 104 and 106 and step 108.

At each cycle of the update tape counter subroutine, the EOT timer is reset in response to each sensed chopper pulse transition and, since the reverse flag is not set, the tape counter is incremented. Foot pedal 30 is, of course, connected to device 10; and since the in process flag now has been set during the cue signal detection subroutine, the update tape counter subroutine may advance to inquiry 238. At this time, inquiry 238 is answered in the negative and the enable flag is reset. Inquiry 242 is answered in the negative (it is seen that the present memory address is equal to 3), and inquiry 278 is answered in the negative. That is, the "instruction present" flag is not set in cue memory location 3. Inquiry 280 is answered in the affirmative because the "instruction present" flag is set in memory location 2, as discussed above. Consequently, although message $M_1$, which now is being played back, contains no instructional information, a subsequent message $M_2$, which has not yet been reached for play back, does contain instructional information. A steady state display of the "instruction" indication is provided.

As message $M_1$ continues to be played back, the cue signal detection and update tape counter subroutines are carried out in the manner discussed above. Eventually, tape T is advanced to the location at which end-of-message cue signal 280 had been recorded. At the next cycle of the update tape counter subroutine, the tape counter will be sufficiently incremented such that inquiry 238 is answered in the affirmative. That is, the count of the tape counter will be incremented to the count [1500] which is stored in memory location 3. At this time, the enable flag is not set and, thus, the update tape counter subroutine advances to step 246 to set this flag. Since the tape had been advanced in its playback mode, inquiry 248 is answered in the negative; and the memory address is decremented from memory address 3 to memory address 2. Next, inquiry 242 is answered in the negative, and inquiry 278 is answered in the affirmative. That is, the "instruction present" flag is seen to be set in memory location 2. It is recalled that, when tape T had been scanned, the detection of the instruction cue signal comprised of cue tones 283 and 285 resulted in the setting of the "instruction present" flag in memory location 2, the location in which the end-of-message cue signal of message $M_2$ had been stored.

Since inquiry 278 is answered in the affirmative, a flashing display of the "instruction" indication is provided. This apprises the operator that the message now in position to be played back, that is, message $M_2$, contains instructional information.

Since device 10 is disposed in its playback mode, the "instruction" indication will flash for so long as message $M_2$ is played back. If the tape T is advanced in its fast forward mode, the "instruction" indication still will flash. Likewise, if a portion of message $M_2$ is reviewed, that is, if the tape is rewound to access a portion of this message once again, a flashing "instruction" indication still will be displayed. It will be recognized that, even when tape T is advanced to the location at which cue tone 283 or cue tone 285 is recorded, this will have no effect upon the flashing display of the "instruction" indication.

Once tape T is advanced to the location at which end-of-message cue signal 282 is recorded, inquiry 238 once again will be answered in the affirmative. The enable flag, which had been reset after the tape had been advanced into message $M_2$, now is set once again, and the memory address is decremented from address 2 to address 1. Inquiry 242 is answered in the negative, and inquiry 278 also is answered in the negative. That is, cue memory location 1 does not have stored therein an "instruction present" flag. Additionally, inquiry 280 is answered in the negative because there are no remaining cue memory locations in which an "instruction present" flag is stored. Consequently, the "instruction" indication is extinguished.

If, while playing back message $M_2$, the tape is rewound, as by the operation of rewind foot pedal switch 36, to a position beyond end-of-message cue signal 280 and into message $M_1$, the update tape counter subroutine is carried out as follows:.

Since the reverse flag now is set, each chopper pulse transition results in a decrementing of the tape count. Inquiries 230 and 236 are answered in the affirmative; and when the tape has been rewound to the location at which end-of-message cue signal 280 is located, inquiry 238 is answered in the affirmative. The enable flag, which had been reset prior to this point, now is set and, since the reverse flag is set, the cue memory address is incremented from its present address 2 to the address 3.

Inquiry 242 is answered in the negative, as is inquiry 278. However, inquiry 280 now is answered in the affirmative because the remaining cue memory locations 2 and 1 contain an "instruction present" flag. More particularly, this flag is set in cue memory location 2. Consequently, a steady state display of the "instruction" indication is provided.

When tape T is rewound from an arbitrary location within the length of message $M_2$, the cue signal detection subroutine is carried out as follows:

Inquiries 102, 104, 110, 112, 114, 116 and 122 are answered in the negative, until end-of-message cue signal 280 is detected. At that time, inquiry 122 is answered in the affirmative and, since the letter cue flag is not set at this time, step 130 is effective to set that flag. Inquiry 132 then is answered in the negative and, if it is assumed that tape T is rewound as a result of the operation of rewind foot pedal switch 36, inquiry 134 also is answered in the negative. Accordingly, the pause timer is reset; and the microprocessor advances to the cue memory subroutine illustrated in FIG. 4.

As illustrated in FIG. 4, inquiry 192 is answered in the affirmative because the in process flag was set upon completing the tape scan operation. Then, the pause flag is set, the capstan motor is deenergized and a warning tone is generated. The microprocessor then returns to the cue signal detection subroutine at inquiry 158.

Since the pause timer has just been reset, inquiry 158 is answered in the negative. The update tape counter subroutine then is executed.

Turning to the flow chart of FIG. 5, since the capstan motor has been deenergized, inquiry 220 is answered in the negative. Similarly, inquiries 256, 258 and 262 all are answered in the negative, thus resetting the EOT timer.

Upon the next cycle through the cue signal detection subroutine, inquiries 102 and 104 are answered in the negative; but inquiry 110 now is answered in the affirmative. It is recalled, from the flow chart shown in FIG. 4, that the pause flag was set upon detecting end-of-message cue signal 280. However, since the pause timer has not yet timed out, the update tape counter subroutine merely is carried out in the manner described above.

The foregoing operation of the cue signal detection subroutine repeats until the pause timer eventually times out. As a numerical example, the pause timer might exhibit a time constant on the order of 1–2 seconds. When inquiry 158 is answered in the affirmative, the pause flag and tape motion flags all are reset. Then, the cue ignore flag is set, the letter cue flag, which had been set upon the detection of end-of-message cue signal 280, is reset, the cue timer is reset and the first cue flag is set. The capstan motor then is re-energized, and the rewind movement of tape T continues. As the tape continues to rewind, the tape counter continues to be decremented, as described above.

During subsequent cycles through the cue signal detection subroutine while tape T is rewound, inquiries 102, 104, 110, 112 and 114 are answered in the negative. However, the cue ignore flag had been set, at 162, and inquiry 116 thus is answered in the affirmative. Inquiry 118 also is answered in the negative because the cue timer had been reset, at 166, during the preceding cycle of the cue signal detection subroutine. Hence, the update tape counter subroutine is carried out as described above.

Eventually, as the microprocessor recycles through the cue signal detection subroutine, the cue timer will time out. At that time, both inquiry 116 and inquiry 118 are answered in the affirmative, resulting in the resetting of the cue ignore and letter cue flags.

Let it now be assumed that, while playing back message $M_2$, fast forward foot pedal switch 38 is operated. As a result, tape T is advanced at a relatively high speed. As the tape is advanced, the tape counter is incremented.

Turning to the cue signal detection subroutine, inquiries 102, 104, 110, 112, 114, 116 and 122 all are answered in the negative until cue tone 283 of the illustrated instruction cue signal is detected. At that time, inquiry 122 is answered in the affirmative and, since the letter cue flag is not set, step 130 is effective in setting this flag. Inquiries 132 and 134 then are answered in the negative, and the pause timer is reset. The microprocessor then advances to the cue memory subroutine illustrated in FIG. 4.

Inquiry 192 is answered in the affirmative, resulting in the setting of the pause flag, the turning off of the capstan and the generation of a suitable warning tone. Then, returning to the flow chart shown in FIGS. 2A-2B, inquiry 158 is answered in the negative, and the update tape counter subroutine is carried out.

Since chopper pulse transitions are not detected, and since the capstan motor is not energized, the EOT timer merely is reset, at 260 (FIG. 5) in the update tape counter subroutine. It is appreciated that the tape merely "pauses" when cue tone 283 is detected.

Returning to the cue signal detection subroutine, inquiries 102 and 104 are answered in the negative, but inquiry 110 now is answered in the affirmative. Since the pause timer has not yet timed out, the loop formed of inquiries 102, 104, 110 and 158, together with the update tape counter subroutine, is recycled. Eventually, the pause timer times out, thus resulting in the resetting of the pause flag, the setting of the cue ignore flag, the resetting of the letter cue flag, the resetting of the cue timer, the setting of the first cue flag and the re-energization of the capstan motor. The tape thus is advanced once again in the foot pedal initiated fast forward mode.

On cycling through the cue signal detection subroutine, the microprocessor advances to inquiry 116, which is answered in the affirmative. It is seen that cue tone 285 will be detected before the cue timer has timed out. However, since the cue ignore flag remains set when cue tone 285 is detected, the cue signal detection subroutine does not advance to inquiry 122. Thus, cue tone 285 is effectively ignored. After the tape has been advanced past cue tone 285, the cue timer times out, whereupon inquiry 118 is answered in the affirmative, and the cue ignore flag is reset.

After cue tone 285 has passed, the cycling through the cue signal detection subroutine results in a negative answer to inquiries 116, 122 and 124, thus resetting the first cue flag. The cue signal detection and update tape counter subroutines are recycled in the manner discussed above, thus resulting in the incrementing of the tape counter and the steady state display of the "instruction" indication, thus indicating that the message $M_2$ which is in position for transcription contains an instruction.

When end-of-message cue signal 282 is detected, it is appreciated, from the foregoing description of the cue signal detection subroutine, that the capstan motor is deenergized such that the tape "pauses" at this end-of-message cue signal. Furthermore, when this end-of-message cue signal is reached, inquiry 238 of the update tape counter subroutine is answered in the affirmative, whereupon the cue memory address is decremented from address 2 to address 1. Since an "instruction present" flag is not stored at cue memory location 1, or at any subsequent cue memory locations, the "instruction" indication is extinguished.

From the foregoing description, it is appreciated that, during a foot pedal initiated fast forward operation, tape T is stopped momentarily at each end-of-message cue signal and at each instruction cue signal. Furthermore, when the tape has been advanced to a message in which an instruction is included, such as message $M_2$, a flashing display of the "instruction" indication is provided. If the tape has been advanced to a message in which no instructions are included, but subsequent messages which have not yet been reached contain one or more instructions, the "instruction" indication is displayed as a steady state indication. Finally, if the tape has been advanced beyond the last message containing an instruction, the "instruction" indication is extinguished.

Let it be assumed that tape T is positioned such that message $M_1$ is in the process of being played back. If SEARCH switch 54 is actuated, the actuator is withdrawn from close magnetic coupling with the tape, and the tape is advanced at relatively high speed. When the cue signal detection subroutine is carried out, once the actuator motor has been deenergized, inquiries 102, 104, 110, 112, 114 and 116 all are answered in the negative. Of course, as the tape is advanced, the tape counter is incremented in response to chopper pulse transitions, as has been described above with respect to the update tape counter subroutine shown in FIG. 5.

When in the search mode, if end-of-message cue signal 280 is detected, inquiry 122 of the cue signal detection subroutine is answered in the affirmative. Inquiry 128 is answered in the negative and the letter cue flag is set. Then, since inquiry 132 is answered in the affirmative, the cue memory subroutine illustrated in FIG. 3 is carried out.

Here, inquiry 172 is answered in the affirmative but, since device 10 is not disposed in its keyboard rewind mode of operation, inquiry 174 is answered in the negative and the cue timer is reset, at 186. Thus, it is seen that the process of incrementing the cue memory address and loading the then present tape count into the addressed cue memory location is by-passed during this search mode. After resetting the cue timer, the first cue flag is set and the update tape counter subroutine is executed.

If, at the next cycle through the cue signal detection subroutine, the same end-of-message cue signal 280 is detected, inquiry 122 is answered in the affirmative and inquiry 128 also is answered in the affirmative. Since the first cue flag had been set, at 188 (FIG. 3), inquiry 138 now is answered in the affirmative, and the microprocessor cycles to the update tape counter subroutine. It is appreciated that tape T continues to be advanced.

When the end of message $M_1$ (and, thus, the beginning of message $M_2$) is reached, the tape count will be substantially equal to the tape count stored in cue memory location 3. Hence, when executing the update tape counter subroutine, inquiry 238 is answered in the affirmative, the cue memory address is decremented, at 252, from address 3 to address 2, and inquiry 278 is answered in the affirmative because the "instruction present" flag is set in cue memory location 2. Hence, a flashing display of the "instruction" indication is provided, thereby apprising the operator that tape T has been advanced to a message that includes instructional information.

When cue tone 283 of the instruction cue signal is reached, this cue tone is detected and, during the cue signal detection subroutine, is interpreted initially as an end-of-message cue signal. Hence, the letter cue flag is set and, as discussed above, the cue timer is reset (at 186) and the first cue flag is set (at 188).

After passing cue tone 283, inquiry 122 of the cue signal detection subroutine is answered in the negative, inquiry 124 also is answered in the negative and the first cue flag now is reset. Since the cue timer (which was reset during the cue memory subroutine illustrated in FIG. 3) has not reached 0.25 seconds, inquiry 118 is answered in the negative and the update tape counter subroutine is carried out. When the second cue tone 285 is reached, inquiry 122 of the cue signal detection subroutine is answered in the affirmative and, since the letter cue flag is set but the first cue flag has been reset, the subroutine advances to inquiry 140. During this rapid advance of tape T, it is expected that cue tone 285 is reached before the cue timer has timed out. Hence, inquiry 140 is answered in the negative. Continuing with this subroutine, since device 10 is operating in its search mode, inquiry 144 is answered in the affirmative and the search flag is reset, the "in play" flag is set and the letter cue flag is reset. By setting the "in play" flag, device 10 is changed over from its search mode to its playback mode. Thus, upon reaching the instruction cue signal, the instructional information which follows that cue signal is played back. The search mode thus functions to advance tape T to the location at which instructional information is recorded and then to effect a play back of that instructional information. Ends of messages are ignored.

Let it be assumed that tape T has been advanced, either by way of the playback mode or the fast forward mode, to a location within message $M_3$. Let it be further assumed that the operator actuates keyboard REWIND switch 56. This initiates the rewind operation, and the tape counter is decremented in response to sensed chopper pulse transitions. When end-of-message cue signal 282 is reached, inquiries 102, 104, 110, 112, 114 and 116 of the cue signal detection subroutine all are answered in the negative, and inquiry 122 now is answered in the affirmative. Inquiry 128 is answered in the negative and the letter cue flag is set. Since inquiry 132 is answered in the negative but inquiry 134 is answered in the affirmative, the cue memory subroutine illustrated in FIG. 3 is carried out. Inquiries 172 and 174 both are answered in the affirmative; and since the in process flag was set at the completion of the initial tape scan operation, inquiry 176 also is answered in the affirmative. Hence, the cue memory subroutine advances to reset the cue timer and to set the first cue flag. The update tape counter subroutine then is carried out.

As shown in FIG. 5, since the reverse flag is set during this rewind operation, each chopper pulse transition serves to decrement the tape counter. Upon reaching end-of-message cue signal 282, the then present tape count is equal to the tape count stored in cue memory location 2 and, thus, inquiry 238 is answered in the affirmative. The cue memory address is incremented (at 250) from address 1 to address 2 at this time, and inquiry 278 is answered in the affirmative. Hence, a flashing display of the "instruction" indication is provided.

It is recognized that the detection of end-of-message cue signal 282 does not interrupt the rewinding of tape T. After passing this cue signal, another cue tone is not detected within the 0.25 second period and, thus, the cue timer times out. Hence, before reaching cue tone 285, the letter cue flag which had been set in response to the detection of cue tone 282 is reset.

It is seen that, as tape T is rewound so as to position message M$_2$, together with the instruction contained therein, opposite the transducer to permit that message to be played back, the "instruction" indication is flashed because a message which includes an instruction now is conditioned to be played back. Upon detecting cue tone 285, inquiry 122 of the cue signal detection subroutine is answered in the affirmative, inquiry 128 is answered in the negative and the letter cue flag is set. Since device 10 is disposed in its keyboard rewind mode of operation, inquiry 134 is answered in the affirmative and the subroutine illustrated in FIG. 3 is carried out. Once again, the cue timer is reset and the first cue flag is set.

Tape T continues to be rewound; and when the "gap" between cue tones 283 and 285 is reached, inquiry 122 is answered in the negative, inquiry 124 also is answered in the negative and the first cue flag which had been set now is reset. At this time, inquiry 118 is answered in the negative.

It is expected that, prior to the expiration of 0.25 seconds following the resetting of the cue timer, cue tone 283 will be detected. As a result, inquiry 122 is answered in the affirmative, inquiry 128 also is answered in the affirmative and inquiry 138 is answered in the negative. Since the cue timer has not yet timed out, inquiry 140 is answered in the negative. Inquiry 144 also is answered in the negative; and the cue ignore flag is set and the cue timer is reset. The "instruction" indication now is displayed, thus apprising the operator that the beginning of instructional information has been reached. The pause timer is reset, at 136, and the cue memory subroutine illustrated in FIG. 4 is carried out.

Since the in process flag is set, the pause flag also is set and the capstan motor is deenergized. Thus, tape T is stopped momentarily, and a suitable warning tone is generated to bring this condition to the attention of the operator.

Continuing with the cue signal detection subroutine, after the warning tone is generated, the subroutine advances to inquiry 158 which, at this time, is answered in the negative. The cue signal detection subroutine will cycle to inquiries 102, 104, 110 and 158, and then the update tape counter subroutine will be carried out, until the pause timer times out and inquiry 158 is answered in the affirmative. The pause flag then is reset, the cue ignore flag is set, the letter cue flag is reset, the cue timer is reset and the first cue flag is set. The capstan motor then is re-energized. Thus, the rewind motion of the tape is resumed following detection of the instruction cue signal.

Upon succeeding cycles of the cue signal detection subroutine, inquiry 116 will be answered in the affirmative and, until the cue timer has reached 0.25 seconds, inquiry 118 will be answered in the negative. When 0.25 seconds have passed, inquiry 118 is answered in the affirmative and the cue ignore flag is reset. This occurs after tape T has been rewound beyond cue tone 283. Hence, inquiry 122 will not be answered in the affirmative until end-of-message cue signal 280 eventually is reached.

From the foregoing description, it is seen that, after the initial tape scan, the actuation of keyboard REWIND switch 56 results in the rewinding of tape T and the pausing at each instruction cue signal. End-of-message cue signals are ignored. Also, as the tape is being rewound, the tape counter is decremented until arriving at an end-of-message cue signal, whereupon the then present tape count will be equal to a tape count stored in the cue memory. At that time, the cue memory address is incremented and the presence of an instruction present flag in the incremented cue memory location is sensed. If the instruction present flag is detected, thus indicating that the particular message to which the tape has been rewound contains instructional information, the "instruction" indicator is flashed. If succeeding messages contain one or more instructions, that is, if the instruction present flag is stored in a cue memory location having a lower value address, a steady state "instruction" indication is displayed. If neither the message to which the tape has been rewound nor any succeeding message contains instructional information, the "instruction" indicator is extinguished.

While the present invention has been particularly shown and described with reference to a preferred embodiment, it will be readily apparent that various changes and modifications may be made without departing from the spirit and scope of the invention. For example, the record medium need not be limited solely to a magnetic tape. As mentioned above, other media are contemplated, for example, the record medium may be in the form of a magnetic disk, a solid-state storage device, such as a memory chip, or a read only memory device, such as an optically readable disk. Also, the messages, instructional information, end-of-message cue signals and instruction cue signals need not be recorded in a common track. Separate tracks may be provided for the cue signals, the instructional information and the messages. Also, various combinations of tracks may be adopted for recording messages, instructional information and cue signals. Still further, although the locations of ends of messages and instructional information, after the record medium has been scanned, is based upon the detection of cue signals, it is appreciated that, if desired, such locating of ends of messages and instructional information may be carried out by comparing the instantaneous tape count, which is incremented and decremented as the record medium is moved, to stored tape counts, the latter representing the locations of the ends of messages and instructional information. Furthermore, although the tape scanning operation is initiated, in the foregoing description, by the actuation of keyboard REWIND switch 56, it is appreciated that, if desired, a separate SCAN switch may be provided for this purpose. Also, although the playback transducer, or head, is withdrawn during fast forward and rewind tape movements, the position of the withdrawn transducer relative to the record medium is sufficient for the detection of the recorded cue signals. Alternatively, an auxiliary cue signal pick-up transducer may be used for this purpose.

It is intended that the appended claims be interpreted as including the foregoing as well as other modifications and variations of the present invention. The appended claims should not be construed so as to be limited solely to the embodiment shown in the accompanying drawings.

What is claimed is:

1. In a device wherein messages are recorded on and/or played back from a storage medium which contains signals comprising end-of-message signals representing the end of one message and/or the beginning of a succeeding message and instruction signals representing the occurrences of instructions, display apparatus comprising instruction detecting means for detecting and displaying an indication of said instruction signals recorded on said storage medium; an instruction indicator display; and instruction signal indicating means including first means responsive to said instruction detecting means for displaying on said instruction indicator display a first indication representing the occurrence of an instruction within the message then in position to be played back, and second means responsive to said instruction detecting means for displaying on said instruction indicator display a second indication different and distinct from said first indication representing the occurrence of an instruction within a subsequent message remaining to be played back.

2. The apparatus of claim 1 wherein said instruction signal indicating means includes third means responsive to said instruction detecting means for displaying on said instruction indicator display a further indication representing the absence of recorded instructions within any of said subsequent messages remaining to be played back.

3. The apparatus of claim 1 wherein said instruction detecting means comprises scanning means for scanning said storage medium to detect the presence of said instruction signals; and sensing means for sensing a stored one of said instruction signals.

4. The apparatus of claim 3 further comprising means for sensing an end-of-message signal stored in the scanned storage medium.

5. The apparatus of claim 4 further comprising memory means for storing in addressable storage locations representations of each sensed end-of-message signal and each sensed instruction signal.

6. The apparatus of claim 5 wherein said memory means includes write means for writing into one of said storage locations a representation of a sensed end-of-message signal and further writing into one of said storage locations a representation of an instruction signal sensed within the message whose ending is represented by the last-mentioned end-of-message signal.

7. The apparatus of claim 6 wherein said instruction signal indicating means comprises memory read means operable when messages are played back from said storage medium for reading out from said memory means at least a portion of the contents of a storage location in which is stored a representation of the end-of-message signal representing the end of the message which has been reached for play back, and means for detecting a representation of an instruction signal in the contents of the storage location then being read out.

8. The apparatus of claim 7 wherein said memory read means reads out from said memory means at least a portion of the contents of those storage locations in which are stored representations of end-of-message signals representing the ends of messages which have not yet been reached.

9. The apparatus of claim 7 wherein said memory read means includes means responsive to the absence of a detected representation of an instruction signal in the contents read out of the last-mentioned storage location to read out at least a portion of the contents of those storage locations in which are stored representations of end-of-message signals representing the ends of messages which have not yet been reached, and said means for detecting detects a representation of a read out instruction signal to cause said instruction signal indicating means to display said second indication.

10. The apparatus of claim 7 further comprising location indicating means for generating a location signal indicative of the location in said storage medium of each sensed end-of-message signal; and wherein said write means writes into said respective storage location the location signal generated when the end-of-message signal is sensed.

11. The apparatus of claim 10 wherein said location indicating means generates a present location signal indicative of the location in said storage medium at which is stored that portion of a message conditioned to be played back; and further comprising comparator means for comparing said present location signal to location signals stored in said memory means, thereby detecting when the end of a message has been reached and determining which message is in condition to be played back.

12. The apparatus of claim 11, further comprising a memory address generator incremented successively during the scanning of said storage medium when end-of-message signals are sensed for addressing the storage locations in said memory means, and means for decrementing said memory address generator when messages are played back from said storage medium and said present location signal corresponds to a stored location signal, whereby the representation of an instruction signal in the storage location addressed by said memory address generator is detected, causing said first indication to be provided.

13. In a device wherein previously recorded messages are played back by a transducer from a bi-directionally movable record medium on which end-of-message and instruction signals are recorded, display apparatus comprising: scanning means for scanning said record medium in a first direction to detect the recorded end-of-message signals and instruction signals; memory means for storing a representation of each detected end-of-message signal and for storing a representation of each detected instruction signal recorded on said record medium within a message whose end is marked by one of said end-of-message signals; sensing means cooperable with said memory means for sensing whether said message recorded on the record medium juxtaposed said transducer contains one of said instruction signals, and for further sensing whether any subsequent message recorded on said record medium to be reached when said record medium is moved in a second direction contains an instruction signal; and indicating means for producing and displaying a first indication when the message juxtaposed said transducer contains one of said instruction signals and displaying a second indication when a subsequent message remaining to be played back contains an instruction signal.

14. The apparatus of claim 13 further comprising counting means incremented when said record medium moves in said first direction and decremented when said record medium moves in said second direction, the count of said counting means corresponding to an end-of-message signal being stored in said memory means when is detected while said record medium is being scanned; and comparator means operable after said record medium has been scanned to compare the count of said counting means to the stored counts in said memory means to determine when an end of a message has been reached.

15. The apparatus of claim 14 wherein said scanning means is responsive to the stopping or reversal of the direction of movement of said record medium to terminate a scanning operation and thereby prevent further scanning of said record medium.

16. The apparatus of claim 14 further comprising memory address means incremented during the scanning of said record medium in response to each detected end-of-message signal for generating a memory address into which said count of said counting means and said instruction signal representation is stored, said memory address means being decremented in response to said comparator means when said record medium moves in said second direction; and wherein said sensing means includes means for sensing an instruction signal representation in said memory means at the address to which said memory address means has been decremented, whereby said first indication is produced.

17. The apparatus of claim 16 wherein said memory address means is incremented when said record medium moves in said first direction after the completion of a scanning operation, and wherein said means for sensing senses an instruction signal representation in the memory means at the address to which said address means has been incremented, whereby said first indication is produced.

18. The apparatus of claim 16 or 17 wherein said sensing means further includes means responsive to the absence of an instruction signal representation at the address then provided by said memory address means for sensing an instruction signal representation in the membry means at any address less than said provided address, whereby said second indication is produced.

19. The apparatus of claim 18 wherein said indicating means includes means responsive to the absence of a sensed instruction signal representation at any address less than said provided address to produce a third indication that none of the messages to be reached contains an instruction signal.

20. The apparatus of claim 16 wherein said end-of-message signal comprises a single frequency burst and said instruction signal comprises a double burst of frequency; wherein said scanning means includes frequency burst detecting means for detecting each burst of frequency recorded on said record medium and for incrementing said memory address means upon detection of each of said single frequency burst; and wherein said apparatus further comprises means for determining if said burst detecting means detects a second burst of frequency within a predetermined time duration following the detection of a first burst and, if so, for clearing the count which had been stored in said memory address, means for decrementing said memory address means, and means for storing upon detection of said double frequency burst said instruction signal representation in the memory address now provided by said memory address means.

21. In an audio playback device wherein previously recorded audio messages are played back from a movable record medium, and wherein end-of-message signals are recorded designating the end of one message and the beginning of another, and instruction signals are recorded designating the location of an instruction message, display apparatus for indicating the presence of an instruction signal within a message positioned for playback and for indicating the presence of an instruction signal within a subsequent message to be played back, comprising: drive means for driving said record medium in a reverse direction for scanning said record medium to detect said end-of-message and instruction signals, and for driving said record medium in a forward direction to play back said messages and to advance said record medium from one message location to another; detecting means operable at least during the scanning of said record medium for detecting said end-of-message and instruction signals; count means for generating a count as said record medium is driven, the count representing the relative present position of said record medium; and programmed processor means operable during the scanning of said record medium to store at an addressed memory location the count of said count means when an end-of-message signal is detected, to store at said addressed memory location an instruction signal representation when an instruction signal is detected, and to increment the memory location address prior to the storage of said count and said instruction signal representation, said programmed processor means being operable after said record medium has been scanned to sense an instruction signal representation stored in the memory location at which is stored the count representing the end of the message which is in position to be played back, whereby a first indication is provided of the presence of an instruction signal within said message in position to be played back, and to sense an instruction signal representation stored in any memory location at which is stored the count representing the end of a message that has not yet been in position to be played back, whereby a second indication is provided of the presence of an instruction signal within a subsequent message to be played back.

22. The apparatus of claim 21 wherein said processor means is programmed to sense when the count of said count means is equal to the count stored in a memory location and then to decrement the memory location address if said record medium is driven in the forward direction or to increment the memory location address if said record medium is driven in the reverse direction, said processor means being further programmed to detect an instruction signal representation stored in the memory location then being addressed whereby said first indication is provided, and in the absence of a detected instruction signal representation in the addressed memory location to detect an instruction signal representation stored in any lesser addressed memory locations whereby said second indication is provided.

23. A method of displaying the presence of instructions included in previously recorded messages to be played back from a record medium, the messages being demarcated by end-of-message signals, and said instructions being represented by instruction signals, said method comprising the steps of scanning said record medium for said instruction signals; storing indications of those messages in which instructions are included providing a first display indication of said instruction if an indication is stored that the message in condition to be played back includes one of said instructions; and providing a second display indication different and distinct from said first display indication if a subsequent message not yet in condition to be played back includes an instruction.

24. The method of claim 23 wherein said step of storing indications of those messages in which instructions are included comprises changing the count of a counter in a first direction as said record medium is scanned; storing the count of said counter when an end-of-message signal is reached, thereby storing an end-of-message count; and storing in association with said end-of-message count an instruction signal representation.

25. The method of claim 24 wherein said step of providing a first display indication if a message in condition to be played back includes an instruction comprises changing the count of said counter in a second direction as messages are played back; sensing when the count of said counter becomes substantially equal to a stored end-of-message count; and providing said first display indication if an instruction signal representation is stored in association with the next succeeding stored end-of-message count.

26. The method of claim 25 wherein said step of providing a second display indication comprises sensing the absence of an instruction signal representation stored in association with said next succeeding stored end-of-message count; and providing said second display indication if an instruction signal representation is stored in association with any remaining stored end-of-message counts.

27. The method of claim 26 wherein said step of storing ends-of-message counts comprises changing in a first direction a memory address when an end-of-message signal is reached while said record medium is being scanned and storing in the memory address said end-of-message count and said instruction signal representation; and wherein said step of providing said first display indication comprises changing in a second direction said memory address when the count of said counter becomes substantially equal to a stored end-of-message count and sensing an instruction signal representation stored at the changed memory address; and wherein said step of providing said second display indication includes sensing an instruction signal representation stored at any of the remaining memory addresses.

28. The method of claim 27 wherein said record medium is movable in a reverse direction for scanning and in a forward direction for message playback and for reaching a subsequent message, and wherein the count of said counter is changed in said second direction when said record medium is moved in the forward direction, and wherein said memory address changes in said first direction if said record medium is moved in the reverse direction and said memory address changes in said second direction if said record medium is moved in the forward direction.

* * * * *